United States Patent
Yun et al.

(10) Patent No.: US 9,654,093 B2
(45) Date of Patent: May 16, 2017

(54) ELECTRONIC DEVICE HAVING A DELAY LOCKED LOOP, AND MEMORY DEVICE HAVING THE SAME

(71) Applicant: Samsung Electronics Co., Ltd., Suwon-si (KR)

(72) Inventors: Won-Joo Yun, Yongin-si (KR); Yong Shim, Suwon-si (KR)

(73) Assignee: SAMSUNG ELECTRONICS CO, LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/955,051

(22) Filed: Dec. 1, 2015

(65) Prior Publication Data

US 2016/0156342 A1 Jun. 2, 2016

(30) Foreign Application Priority Data

Dec. 1, 2014 (KR) .......................... 10-2014-0169579

(51) Int. Cl.
*H03L 7/06* (2006.01)
*H03K 7/08* (2006.01)
*H03L 7/085* (2006.01)
*H03K 5/156* (2006.01)

(52) U.S. Cl.
CPC ............. *H03K 7/08* (2013.01); *H03K 5/1565* (2013.01); *H03L 7/085* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,859,081 B2 | 2/2005 | Hong et al. | |
| 7,020,228 B2 | 3/2006 | Miyano | |
| 7,598,783 B2 | 10/2009 | Shin et al. | |
| 7,821,310 B2 * | 10/2010 | Yun | H03L 7/0814 327/149 |
| 7,990,194 B2 * | 8/2011 | Shim | G11C 7/22 327/149 |
| 8,040,169 B2 * | 10/2011 | Chung | H03L 7/0812 327/149 |
| 8,242,821 B2 * | 8/2012 | Bae | H03K 5/1565 327/149 |

(Continued)

*Primary Examiner* — Adam Houston
(74) *Attorney, Agent, or Firm* — Muir Patent Law, PLLC

(57) ABSTRACT

An electronic device includes a first duty cycle correction circuit, a delay line, a second duty cycle correction circuit, and a delay control circuit. The first duty cycle correction circuit is configured to detect a duty cycle error of a clock signal by performing time-to-digital conversion on the clock signal, and to generate a corrected clock signal by adjusting a duty cycle of the clock signal based on the duty cycle error of the clock signal. The delay line is configured to generate a delayed corrected clock signal by delaying the corrected clock signal based on a delay control code The second duty cycle correction circuit is configured to detect a duty cycle error of a first output clock signal received through a feedback loop, and to generate a second output clock signal by adjusting duty cycle of the delayed corrected clock signal based on the duty cycle error of the first output clock signal. The delay control circuit is configured to generate the delay control code based on the clock signal and the first output clock signal.

18 Claims, 26 Drawing Sheets

(56) References Cited

U.S. PATENT DOCUMENTS

| | | | |
|---|---|---|---|
| 8,390,351 B2* | 3/2013 | Choi | G11C 7/222 327/149 |
| 8,487,680 B1* | 7/2013 | Chung | H03K 5/1565 327/172 |
| 8,581,650 B2* | 11/2013 | Kim | H03L 7/089 327/156 |
| 8,674,733 B2 | 3/2014 | Kim | |
| 2007/0182470 A1* | 8/2007 | Heyne | G06F 1/10 327/158 |
| 2009/0231006 A1* | 9/2009 | Jang | H03K 5/151 327/175 |
| 2012/0212268 A1* | 8/2012 | Kim | H03L 7/07 327/158 |
| 2014/0152358 A1* | 6/2014 | Seo | H03K 5/1565 327/156 |
| 2014/0184292 A1* | 7/2014 | Lin | H03K 3/017 327/175 |
| 2016/0156342 A1* | 6/2016 | Yun | H03K 7/08 327/158 |

\* cited by examiner

ELECTRONIC DEVICE HAVING A DELAY LOCKED LOOP, AND MEMORY DEVICE HAVING THE SAME

CROSS-REFERENCE TO RELATED APPLICATION(S)

This application claims priority under 35 USC §119 to Korean Patent Application No. 10-2014-0169579, filed on Dec. 1, 2014 in the Korean Intellectual Property Office (KIPO), the contents of which are herein incorporated by reference in their entirety.

BACKGROUND

A delay locked loop (DLL) corrects a duty cycle error of an input clock signal to generate an output clock signal that is synchronized with the input clock signal.

Generally, a semiconductor memory device includes a delay locked loop such that the semiconductor memory device outputs data in synchronization with an input clock signal. For example, the delay locked loop may generate an output clock signal, which is synchronized with the input clock signal, and the semiconductor memory device may output the data in synchronization with the output clock signal such that the data is provided in synchronization with the input clock signal. Therefore, as an operation speed of a semiconductor memory device increases, a delay locked loop operating in a high speed is often used.

If a delay locked loop corrects a duty cycle error of an input clock signal in a digital manner, an accuracy of the delay locked loop decreases. Alternately, if a delay locked loop corrects a duty cycle error of an input clock signal in an analog manner, an operation speed of the delay locked loop decreases.

SUMMARY

Some example embodiments are directed to provide a delay locked loop (DLL) that operates at a high speed and at a high resolution.

Some example embodiments are directed to provide a memory device including the delay locked loop. Either of these may be referred to as an electronic device.

According to example embodiments, an electronic device includes a first duty cycle correction circuit, a delay line, a second duty cycle correction circuit and a delay control circuit. The first duty cycle correction circuit detects a duty cycle error of a clock signal, by performing a time-to-digital conversion on the clock signal, and generates a corrected clock signal, by adjusting a duty cycle of the clock signal based on the detected duty cycle error of the clock signal. The delay line generates a delayed corrected clock signal by delaying the corrected clock signal based on a delay control code. The second duty cycle correction circuit receives a first output clock signal through a feedback loop, detects a duty cycle error of the first output clock signal by performing an integration operation on the first output clock signal, and generates a second output clock signal by adjusting a duty cycle of the delayed corrected clock signal based on the detected duty cycle error of the first output clock signal. The delay control circuit generates the delay control code based on the first clock signal and the output clock signal.

In example embodiments, the first duty cycle correction circuit may include a duty cycle error detection circuit configured to generate a sign signal, which indicates a longer period between a high level period of the clock signal and a low level period of the clock signal, and a duty error digital code, which corresponds to a difference between a length of the high level period of the clock signal and a length of the low level period of the clock signal. The first duty cycle correction circuit may further include a phase align circuit configured to output one of the clock signal and an inverted clock signal, which corresponds to an inverted version of the clock signal, as a first internal clock signal based on a logic level of the sign signal, and to generate a second internal clock signal, by delaying the other one of the clock signal and the inverted clock signal by an amount of time corresponding to half of the duty error digital code. The first duty cycle correction circuit may further include a clock synthesis circuit configured to generate the corrected clock signal, which toggles at each rising edge of the first internal clock signal and each rising edge of the second internal clock signal.

The duty cycle error detection circuit may include a first digital code generator configured to generate a high digital code and a low digital code, which correspond to the length of the high level period of the clock signal and the length of the low level period of the clock signal, respectively, to determine a longer period and a shorter period between the high level period of the clock signal and the low level period of the clock signal, based on the high digital code and the low digital code, to generate the sign signal indicating the longer period of the clock signal, and to output one of the high digital code and the low digital code, which corresponds to the shorter period of the clock signal, as a first digital code, a clock delay circuit configured to generate a delayed clock signal by delaying the clock signal by an amount of time corresponding to the first digital code, and a second digital code generator configured to generate the duty error digital code, which corresponds to a length from a start of the longer period of the delayed clock signal to an end of the longer period of the clock signal, based on the logic level of the sign signal.

The first digital code generator may generate the high digital code and the low digital code by performing the time-to-digital conversion on the length of the high level period of the clock signal and the length of the low level period of the clock signal, respectively, based on a first unit delay, and the second digital code generator may generate the duty error digital code by performing the time-to-digital conversion on the length from the start of the longer period of the delayed clock signal to the end of the longer period of the clock signal based on a second unit delay smaller than the first unit delay.

The clock delay circuit may generate the delayed clock signal by delaying the clock signal for a first delay time generated by performing a digital-to-time conversion on the first digital code based on the first unit delay. The phase align circuit may generate the second internal clock signal by delaying one of the clock signal and the inverted clock signal for a second delay time generated by performing the digital-to-time conversion on half of the duty error digital code, which may be based on the second unit delay.

The first digital code generator may include a first pulse generator configured to generate a first pulse signal having a first length corresponding to the length of the high level period of the clock signal, a second pulse generator configured to generate a second pulse signal having a second length corresponding to the length of the low level period of the clock signal, a first coarse time-to-digital converter configured to generate the high digital code by performing the time-to-digital conversion on the first length of the first pulse signal based on the first unit delay, and a second coarse time-to-digital converter configured to generate the low digital code by performing the time-to-digital conversion on the second length of the second pulse signal based on the first unit delay. The first digital code generator may include a coarse controller configured to determine the longer period and the shorter period between the high level period of the clock signal and the low level period of the clock signal based on the high digital code and the low digital code, to output the sign signal having a logic level corresponding to the longer period of the clock signal, and to output one of the high digital code and the low digital code, which corresponds to the shorter period of the clock signal, as the first digital code.

The first duty cycle correction circuit may further include a multiplexer configured to output one of the clock signal and the corrected clock signal in response to a bypass signal, wherein the first digital code generator may activate the bypass signal when the high digital code is identical to the low digital code.

The first duty cycle correction circuit may further include an OR gate configured to perform an OR operation on a first control signal and a second control signal to generate a bypass signal, and a multiplexer configured to output one of the clock signal and the corrected clock signal in response to the bypass signal, wherein the first digital code generator may activate the first control signal when the high digital code is identical to the low digital code, and the second digital code generator may activate the second control signal when the duty error digital code is smaller than a threshold code.

The phase align circuit may include a phase splitter configured to receive the clock signal, and to output the clock signal and the inverted clock signal in synchronization with each other, a first path selector configured, based on the logic level of the sign signal, to output one of the clock signal and the inverted clock signal as the first internal clock signal and to output the other one of the clock signal and the inverted clock signal as a third internal clock signal, a clock delay circuit configured to generate the second internal clock signal by delaying the third internal clock signal for a time corresponding to half of the duty error digital code, and a second path selector configured, based on the logic level of the sign signal, to output one of the first internal clock signal and the second internal clock signal through a first output electrode and to output the other one of the first internal clock signal and the second internal clock signal through a second output electrode.

The first path selector may output the inverted clock signal as the first internal clock signal and output the clock signal as the third internal clock signal when the sign signal represents that the high level period of the clock signal is longer than the low level period of the clock signal, and output the clock signal as the first internal clock signal and output the inverted clock signal as the third internal clock signal when the sign signal represents that the low level period of the clock signal is longer than the high level period of the clock signal.

The clock synthesis circuit may include a multiplexer configured to output one of the first internal clock signal and the second internal clock signal as a control clock signal in response to a clock selection signal, and a flip-flop configured to latch the clock selection signal in synchronization with a rising edge of the control clock signal, to output the latched signal as the corrected clock signal, and to output an inverted version of the corrected clock signal as the clock selection signal.

The clock synthesis circuit may include a first frequency divider configured to generate a first divided clock signal, which toggles at each rising edge of one of the first internal clock signal and the second internal clock signal, a second frequency divider configured to generate a second divided clock signal, which toggles at each rising edge of the other one of the first internal clock signal and the second internal clock signal, and an exclusive OR gate configured to perform an exclusive-OR (XOR) operation on the first divided clock signal and the second divided clock signal to generate the corrected clock signal.

In example embodiments, the second duty cycle correction circuit may include an integrator configured to generate a first voltage and a second voltage by performing the integration operation on a high level period of the first output clock signal and a low level period of the first output clock signal, respectively, a comparator configured to compare a magnitude of the first voltage with a magnitude of the second voltage to generate an up-down signal, a counter configured to generate a duty control code based on the up-down signal, and a duty adjust circuit configured to generate a temporary clock signal, which transitions with a slope based on the duty control code, in a process of inverting the delayed corrected clock signal, and to generate the second output clock signal by inverting the temporary clock signal.

In example embodiments, the delay control circuit may include a replica delay circuit configured to generate a delayed output clock signal by delaying the first output clock signal, a phase detector configured to compare a phase of the clock signal and a phase of the delayed output clock signal to generate a phase control signal, and a code generator configured to generate the delay control code based on the phase control signal.

According to example embodiments, the second output clock signal is synchronized with the clock signal, and does not include a duty cycle error of the clock signal. The electronic device further includes a memory cell array including a plurality of memory cells, and a data input/output buffer configured to store data read from the plurality of memory cells, and to output the data in synchronization with the second output clock signal.

Some example embodiments may be directed to provide an electronic device that respectively operates to correct duty cycle errors in a digital and analog manner. For example, the first duty cycle correction circuit may perform digital operations and the second duty cycle correction circuit may perform at least one analog operation.

BRIEF DESCRIPTION OF THE DRAWINGS

Illustrative, non-limiting example embodiments will be more clearly understood from the following detailed description in conjunction with the accompanying drawings.

DETAILED DESCRIPTION

Figure 1:
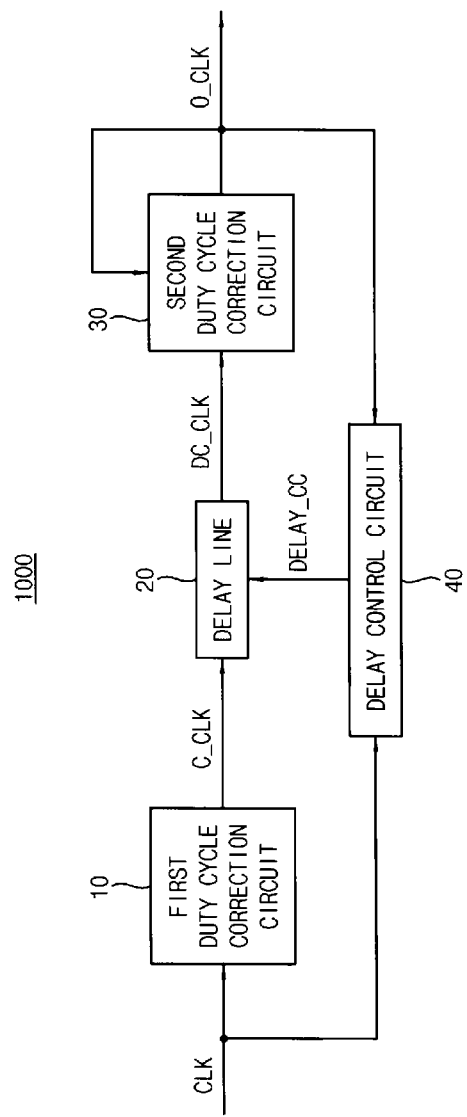
FIG. 1 is a block diagram illustrating a delay locked loop (DLL) according to example embodiments.

Various example embodiments will be described more fully with reference to the accompanying drawings, in which some example embodiments are shown. The present inventive concept may, however, be embodied in many different forms and should not be construed as limited to the embodiments set forth herein. These exemplary embodiments are just that—examples—and many implementations and varia-
tions are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Terms such as "same," or "equal," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a delay locked loop (DLL) according to example embodiments.

Referring to FIG. 1, a delay locked loop 1000 includes a first duty cycle correction circuit 10, a delay line 20, also referred to as a delay circuit, a second duty cycle correction circuit 30, and a delay control circuit 40.

The first duty cycle correction circuit 10 receives a clock signal CLK. The first duty cycle correction circuit 10 generates a corrected clock signal C_CLK by correcting a duty cycle error of the clock signal CLK in a digital manner. For example, the first duty cycle correction circuit 10 may detect the duty cycle error of the clock signal CLK by performing a time-to-digital conversion on the clock signal CLK, and generate the corrected clock signal C_CLK by adjusting a duty cycle of the clock signal CLK based on the detected duty cycle error of the clock signal CLK.

The delay line 20 may generate a delayed corrected clock signal DC_CLK by delaying the corrected clock signal C_CLK based on a delay control code DELAY_CC received from the delay control circuit 40.

The second duty cycle correction circuit 30 generates an output clock signal O_CLK by correcting a duty cycle error of the delayed corrected clock signal DC_CLK in an analog manner. For example, the second duty cycle correction circuit 30 may receive the output clock signal O_CLK (e.g., a first instance or iteration of the output clock signal O_CLK at a first time, also described as a first output clock signal) through a feedback loop, detect a duty cycle error of the output clock signal O_CLK (e.g., the first output clock signal) by performing an integration operation on the output clock signal O_CLK, and generate the output clock signal O_CLK (e.g., a second instance or iteration of the output clock signal O_CLK at a second time, also described as a second output clock signal) by adjusting a duty cycle of the delayed corrected clock signal DC_CLK based on the detected duty cycle error of the first output clock signal O_CLK.

In general, certain clock signals may be referred to herein relatively speaking with respect to a particular component. For example, with respect to delay line 20, the clock signal input to the delay line 20 (e.g., corrected clock signal C_CLK) may be referred to as a clock signal or input clock signal in relation to the clock signal output from the delay line 20 (e.g., delayed corrected clock signal DC_CLK), which may be referred to in relation to the clock signal input to the delay line 20 as a delayed clock signal. Similarly, with respect to second duty cycle correction circuit 30, the clock signal input to the second duty cycle correction circuit 30 (e.g., delayed corrected clock signal DC_CLK) may be referred to as a clock signal or input clock signal in relation to the clock signal output from the second duty cycle correction circuit 30 (e.g., output clock signal O_CLK), which may also be referred to as a duty cycle corrected signal.

The delay control circuit 40 receives the clock signal CLK and the output clock signal O_CLK. The delay control circuit 40 generates the delay control code DELAY_CC based on the clock signal CLK and the output clock signal O_CLK. For example, at different times, the delay control circuit 40 receives different ones of the output clock signals O_CLK (e.g., first, second, third, etc., iterations), and for each of those received signals, a delay control code DELAY CC may be generated.

For example, the delay control circuit 40 may compare a phase of the clock signal CLK with a phase of the output clock signal O_CLK (or in some cases the phase of the clock signal with a phase of a delayed output clock signal DO_CLK based on the output clock signal O_CLK, as described for example in connection with FIG. 25 below). The delay control circuit 40 may increase the delay control code DELAY_CC when the clock signal CLK leads the output clock signal O_CLK, and decrease the delay control code DELAY_CC when the clock signal CLK lags the output clock signal O_CLK.

The delay line 20 may increase a delay time of the corrected clock signal C_CLK to generate the delayed corrected clock signal DC_CLK when the delay control code DELAY_CC increases, and decrease a delay time of the corrected clock signal C_CLK to generate the delayed corrected clock signal DC_CLK when the delay control code DELAY_CC decreases. The delay line 20 may be implemented by any known structure (e.g., including a series of inverters) that is able to delay the corrected clock signal C_CLK for a time corresponding to the delay control code DELAY_CC.

As described above, the first duty cycle correction circuit 10 may generate the corrected clock signal C_CLK by correcting the duty cycle error of the clock signal CLK in the digital manner based on at least one time-to-digital conversion without using a feedback loop. Therefore, the first duty cycle correction circuit 10 may correct the duty cycle error of the clock signal CLK at a relatively high speed to generate the corrected clock signal C_CLK while a resolution of the first duty cycle correction circuit 10 is relatively low due to a quantization error or limitation caused by the time-to-digital conversion.

On the other hand, the second duty cycle correction circuit 30 may receive the output clock signal O_CLK through the feedback loop, and generate the output clock signal O_CLK (e.g., an adjusted output clock signal) by correcting the duty cycle error of the delayed corrected clock signal DC_CLK in the analog manner based on the integration operation performed on the output clock signal O_CLK. Therefore, the second duty cycle correction circuit 30 may correct the duty cycle error of the delayed corrected clock signal DC_CLK precisely at a relatively high resolution to generate the output clock signal O_CLK.

Therefore, in the delay locked loop 1000 according to example embodiments, the first duty cycle correction circuit 10 may correct the duty cycle error of the clock signal CLK at a relatively high speed (e.g., without using a feedback loop) to generate the corrected clock signal C_CLK in a first stage, the delay line 20 may delay the corrected clock signal C_CLK based on the delay control code DELAY_CC to generate the delayed corrected clock signal DC_CLK in a second stage, and the second duty cycle correction circuit 30 may correct the duty cycle error of the delayed corrected clock signal DC_CLK precisely at a relatively high resolution using a feedback loop to generate the output clock signal O_CLK in a third stage. As such, the delay locked loop 1000 may operate at a high speed while having a high resolution.

Figure 2:
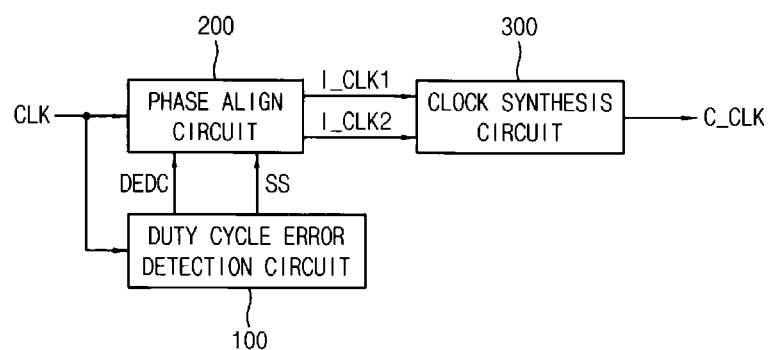
FIG. 2 is a block diagram illustrating an example of a first duty cycle correction circuit included in the delay locked loop of FIG. 1.

FIG. 2 is a block diagram illustrating an example of a first duty cycle correction circuit included in the delay locked loop of FIG. 1.

Referring to FIG. 2, the first duty cycle correction circuit 10 may include a duty cycle error detection circuit 100, a phase align circuit 200 and a clock synthesis circuit 300.

The duty cycle error detection circuit 100 may receive the clock signal CLK, and generate a sign signal SS, which indicates which between a high level period of the clock signal CLK and a low level period of the clock signal CLK is longer. In addition, the duty cycle error detection circuit 100 may generate a duty error digital code DEDC, which corresponds to a difference between a length of the high level period of the clock signal CLK and a length of the low level period of the clock signal CLK. The length of each of the high level and low level period may be a duration of time. The duty error digital code DEDC may represent a difference in actual time (e.g., duration of time), or a relative difference between the high level duration and the low level duration (e.g., 20% if the one duration is 60% of the overall period and the other duration is 40% of the overall period).

The phase align circuit 200 may output one of the clock signal CLK and an inverted clock signal, which corresponds to an inverted version of the clock signal CLK, as a first internal clock signal I_CLK1 based on a logic level of the sign signal SS received from the duty cycle error detection circuit 100, and generate a second internal clock signal I_CLK2 by delaying the other one of the clock signal CLK and the inverted clock signal for a time corresponding to a half of the duty error digital code DEDC received from the duty cycle error detection circuit 100. The phase align circuit 200 may therefore output two different clock signals I_CLK1 and I_CLK2.

The clock synthesis circuit 300 may generate a corrected clock signal C_CLK, which toggles at each rising edge of the first internal clock signal I_CLK1 and each rising edge of the second internal clock signal I_CLK2. The clock synthesis circuit 300 may therefore output the corrected clock signal C_CLK, based on the first internal clock signal I_CLK1 and the second internal clock signal I_CLK2.

According to the above description related to FIG. 2, the duty cycle error detection circuit 100 may provide the duty error digital code DEDC, which corresponds to a difference between a length of the high level period of the clock signal CLK and a length of the low level period of the clock signal CLK, to the phase align circuit 200, and the phase align circuit 200 may generate the second internal clock signal I CLK2 by delaying one of the clock signal CLK and the inverted clock signal for a time corresponding to a half of the duty error digital code DEDC. In another embodiment, the duty cycle error detection circuit 100 may provide a digital code corresponding to a half of the duty error digital code DEDC to the phase align circuit 200, and the phase align circuit 200 may generate the second internal clock signal I_CLK2 by delaying one of the clock signal CLK and the inverted clock signal for a time corresponding to the digital code received from the duty cycle error detection circuit 100.

Figure 3:
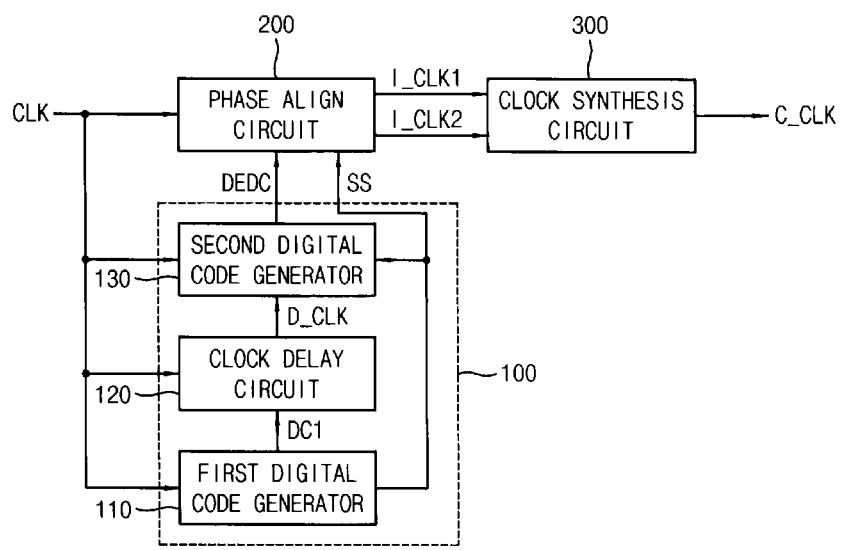
FIG. 3 is a block diagram illustrating an example of the first duty cycle correction circuit of FIG. 2.

FIG. 3 is a block diagram illustrating an example of the first duty cycle correction circuit of FIG. 2.

Referring to FIG. 3, a first duty cycle correction circuit 10*a* may include the duty cycle error detection circuit 100, the phase align circuit 200 and the clock synthesis circuit 300.

The duty cycle error detection circuit 100 included in the first duty cycle correction circuit 10*a* may include a first digital code generator 110, a clock delay circuit 120 and a second digital code generator 130.

The first digital code generator 110 may receive the clock signal CLK, and generate a high digital code HDC and a low digital code LDC, which correspond to the length of the high level period of the clock signal CLK and the length of the low level period of the clock signal CLK, respectively. Each of the high digital code and low digital code may be represented, for example, by one or more bits.

In some example embodiments, the first digital code generator 110 may generate the high digital code by performing the time-to-digital conversion on the length of the high level period of the clock signal CLK based on a first unit delay (e.g., first predetermined period of time), and generate the low digital code by performing the time-to-digital conversion on the length of the low level period of the clock signal CLK based on the first unit delay.

The first digital code generator 110 may determine a longer period and a shorter period between the high level period of the clock signal CLK and the low level period of the clock signal CLK based on the high digital code and the low digital code, and generate the sign signal SS representing the longer period of the clock signal CLK. For example, the first digital code generator 110 may generate the sign signal SS having a first logic level when the high level period of the clock signal CLK is longer than the low level period of the clock signal CLK, and generate the sign signal SS having a second logic level when the low level period of the clock signal CLK is longer than the high level period of the clock signal CLK. In some example embodiments, the first logic level may be a high logic level (e.g., "1"), and the second logic level may be a low logic level (e.g., "0"). In other example embodiments, the first logic level may be a low logic level, and the second logic level may be a high logic level.

In addition, in one embodiment, the first digital code generator 110 may output one of the high digital code and the low digital code, which corresponds to the shorter period of the clock signal CLK, as a first digital code DC1.

The clock delay circuit 120 may generate a delayed clock signal D_CLK by delaying the clock signal CLK by a delay time corresponding to the first digital code DC1 received from the first digital code generator 110.

In some example embodiments, the clock delay circuit 120 may generate the delayed clock signal D_CLK by delaying the clock signal CLK by a delay time generated by performing a digital-to-time conversion on the first digital code DC1 based on the first unit delay.

The second digital code generator 130 may determine which of the high level period of the clock signal CLK and the low level period of the clock signal CLK is longer, based on the logic level of the sign signal SS received from the first digital code generator 110. In certain embodiments, the second digital code generator 130 may generate the duty error digital code DEDC, which corresponds to a length from a start of the longer period of the delayed clock signal D_CLK to an end of the longer period of the clock signal CLK.

In some example embodiments, the second digital code generator 130 may generate the duty error digital code DEDC by performing a time-to-digital conversion on a length of time that spans from the start of the longer period of the delayed clock signal D_CLK to the end of the longer period of the clock signal CLK based on a second unit delay, which is smaller than the first unit delay. The second unit delay, being less than the first unit delay, may provide a greater level of resolution for correcting the detected duty cycle error.

According to certain embodiments, if the high level period of the delayed clock signal D_CLK (or the clock signal CLK) is longer than the low level period of the delayed clock signal D_CLK (or the clock signal CLK), then the longer period is the high level period. If the low level period of the delayed clock signal D_CLK (or the clock signal CLK) is longer than the high level period of the delayed clock signal D_CLK (or the clock signal CLK) then the longer period is the low level period. If the high level period of the delayed clock signal D_CLK (or the clock signal CLK) is equal to the low level period of the delayed clock signal D_CLK (or the clock signal CLK), then the time-to-digital conversion, in generating the duty error digital code DEDC, may be performed using either the high level period or the low level period.

In this case, the phase align circuit 200 may generate the second internal clock signal I_CLK2 by delaying one of the clock signal CLK and the inverted clock signal by a delay time generated by performing the digital-to-time conversion on the half of the duty error digital code DEDC based on the second unit delay.

Figure 4:
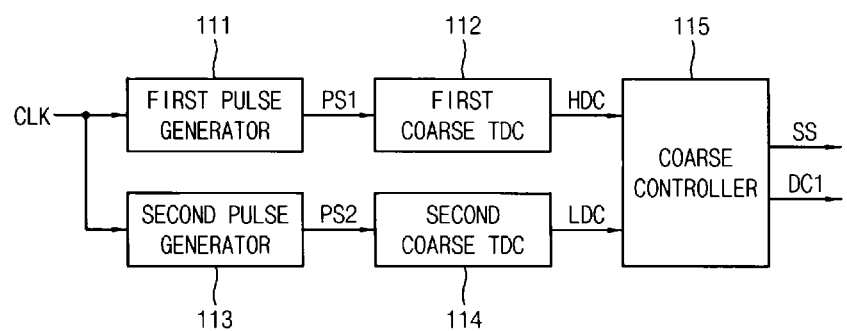
FIG. 4 is a block diagram illustrating an example of a first digital code generator included in the first duty cycle correction circuit of FIG. 3.

FIG. 4 is a block diagram illustrating an example of a first digital code generator included in the first duty cycle correction circuit of FIG. 3.

Referring to FIG. 4, the first digital code generator 110 may include a first pulse generator 111, a first coarse time-to-digital converter 112, a second pulse generator 113, a second coarse time-to-digital converter 114 and a coarse controller 115.

The first pulse generator 111 may receive the clock signal CLK, and generate a first pulse signal PS1 having a length corresponding to the length of the high level period of the clock signal CLK.

The first coarse time-to-digital converter 112 may generate the high digital code HDC by performing the time-to-digital conversion on the length of the first pulse signal PS1 based on the first unit delay.

Figure 5:
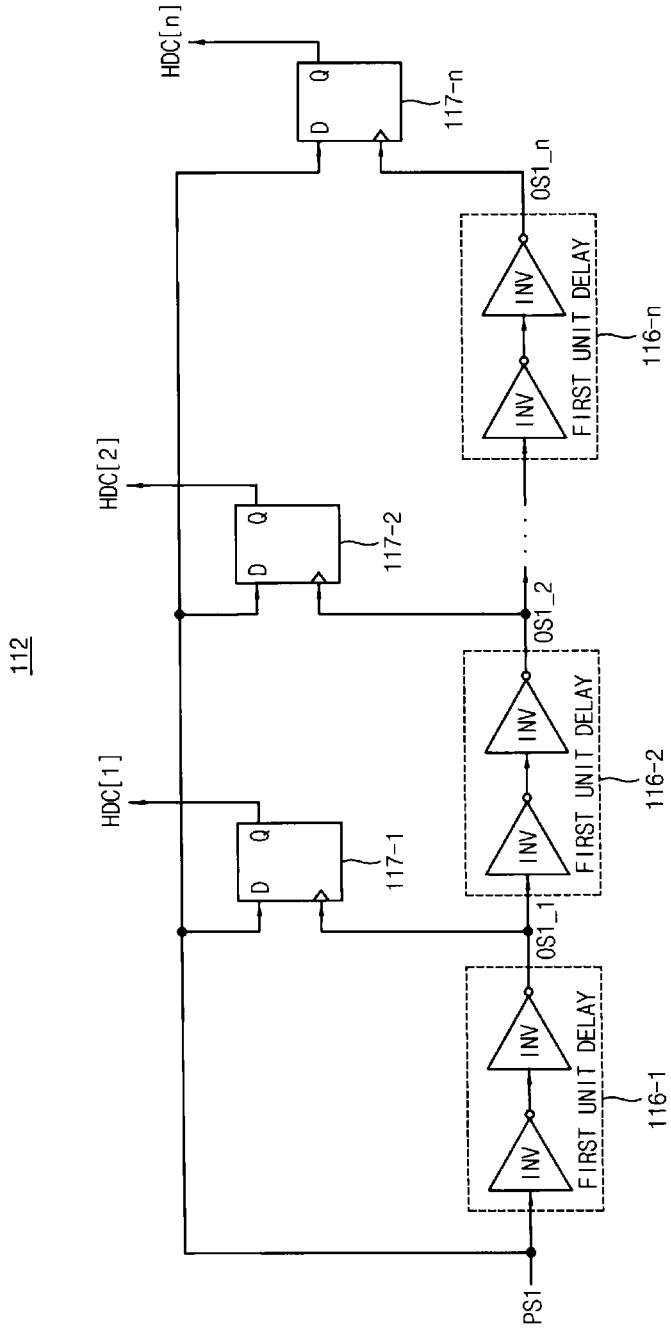
FIG. 5 is a circuit diagram illustrating an example of a first coarse time-to-digital converter included in the first digital code generator of FIG. 4.

FIG. 5 is a circuit diagram illustrating an example of a first coarse time-to-digital converter (TDC) included in the first digital code generator of FIG. 4.

Referring to FIG. 5, the first coarse time-to-digital converter 112 may include first through n-th delay circuits 116-1, 116-2, . . . , 116-n and first through n-th flip-flops 117-1, 117-2, . . . , 117-n. Here, n represents an integer equal to or greater than two.

The first through n-th delay circuits 116-1, 116-2, . . . , 116-n may be coupled in series. For example, an output signal of the k-th delay circuit 116-k may be provided as an input signal of the (k+1)-th delay circuit 116-(k+1). Here, k represents a positive integer equal to or smaller than (n−1). The first pulse signal PS1 generated by the first pulse generator 111 may be provided as an input signal of the first delay circuit 116-1.

In certain embodiments, each of the first through n-th delay circuits 116-1, 116-2, . . . , 116-n may generate an output signal by delaying the input signal for the first unit delay. The output signals of the first through n-th delay circuits 116-1, 116-2, . . . , 116-n may be referred to as first through n-th output signals OS1_1, OS1_2, . . . , OS1_n, respectively.

In some example embodiments, as illustrated in FIG. 5, each of the first through n-th delay circuits 116-1, 116-2, . . . , 116-n may include an even number of inverters INV.

The first through n-th flip-flops 117-1, 117-2, . . . , 117-n may latch the first pulse signal PS1 in synchronization with a rising edge of the first through n-th output signals OS1_1, OS1_2, . . . , OS1_n, respectively, and output the latched signals as first through n-th bit data HDC[1], HDC[2], . . . , HDC[n], respectively.

The high digital code HDC output by the first coarse time-to-digital converter 112 may include the first through n-th bit data HDC[1], HDC[2], . . . , HDC[n]. For example, the first bit data HDC[1], which is output by the first flip-flop 117-1, may correspond to a first bit of the high digital code HDC, the second bit data HDC[2], which is output by the second flip-flop 117-2, may correspond to a second bit of the high digital code HDC, and the n-th bit data HDC[n], which is output by the n-th flip-flop 117-n, may correspond to an n-th bit of the high digital code HDC.

Figure 6:
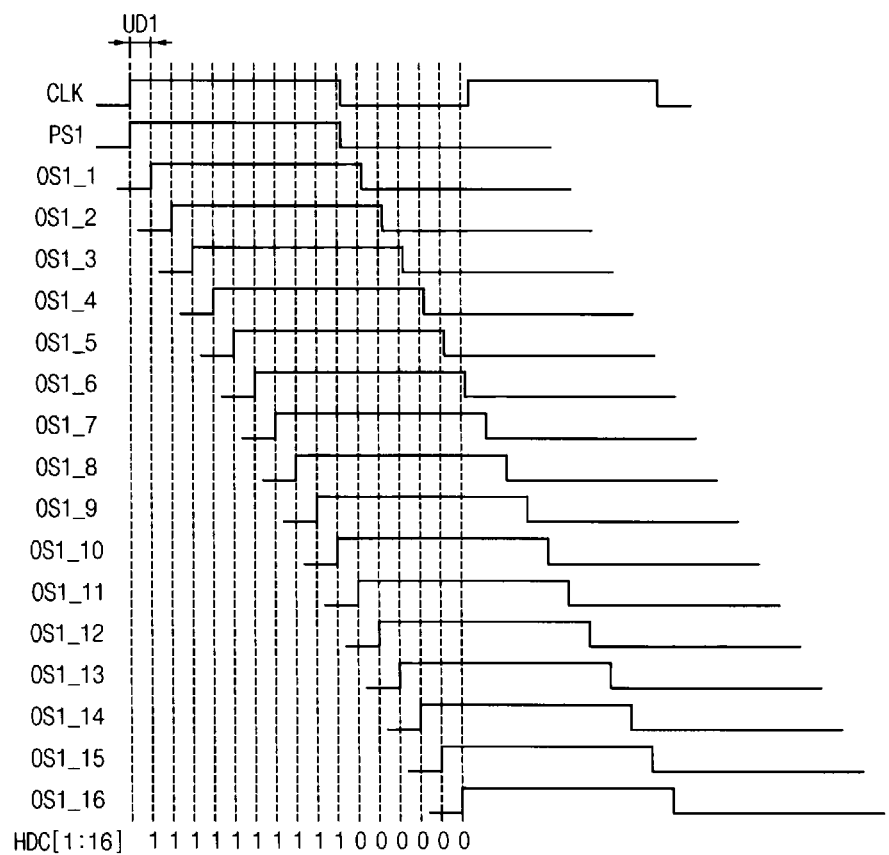
FIG. 6 is a diagram for describing an exemplary operation of the first coarse time-to-digital converter of FIG. 5.

FIG. 6 is a diagram for describing an operation of the first coarse time-to-digital converter of FIG. 5.

In FIG. 6, an operation of the first coarse time-to-digital converter 112 in the case that n is 16 is illustrated as an example.

As illustrated in FIG. 6, since the first pulse signal PS1, which has a high level length corresponding to the length of the high level period of the clock signal CLK, is provided as the input signal to the first delay circuit 116-1, the first through n-th delay circuits 116-1, 116-2, . . . , 116-n may generate the first through n-th output signals OS1_1, OS1_2, . . . , OS1_n, respectively, by consecutively delaying the first pulse signal PS1 by the first unit delay UD1.

As described above, the first through n-th flip-flops 117-1, 117-2, . . . , 117-n may latch the first pulse signal PS1 in synchronization with a rising edge of the first through n-th output signals OS1_1, OS1_2, . . . , OS1_n, respectively, and output the latched signals as first through n-th bit data HDC[1], HDC[2], . . . , HDC[n], respectively.

Therefore, referring to FIG. 6, since the first pulse signal PS1 is in a high logic level at a rising edge of each of the first through tenth output signals OS1_1, OS1_2, . . . , OS1_10, the first through tenth bit data HDC[1], HDC[2], . . . , HDC[10], which are output by the first through tenth flip-flops 117-1, 117-2, . . . , 117-10, respectively, may have a high logic level. On the other hand, since the first pulse signal PS1 is in a low logic level at a rising edge of each of the eleventh through sixteenth output signals OS1_11, OS1_12, . . . , OS1_16, the eleventh through sixteenth bit data HDC[11], HDC[12], . . . , HDC[16], which are output by the eleventh through sixteenth flip-flops 117-11, 117-12, . . . , 117-16, respectively, may have a low logic level. In this example, 16 bits of data are used in the representation of the HDC signal but the present embodiments are not limited thereto. The number of bits used to model the high level period of the clock signal CLK, via use of the first pulse signal PS1, may therefore be any integer equal to or greater than two.

In the above example, the first coarse time-to-digital converter 112 may output "1111111111000000" as the high digital code HDC. As such, the number of "1s" included in the high digital code HDC may be proportional to the length of the pulse (e.g. of the high level) of the first pulse signal PS1.

Although a structure and an operation of the first coarse time-to-digital converter 112 are described above with reference to FIGS. 5 and 6, example embodiments are not limited thereto. The first coarse time-to-digital converter 112 may be implemented by any structure that is able to convert the length of the pulse of the first pulse signal PS1 into a digital value.

Referring again to FIG. 4, the second pulse generator 113 may receive the clock signal CLK, and generate a second pulse signal PS2 having a length corresponding to the length of the low level period of the clock signal CLK.

The second coarse time-to-digital converter (TDC) 114 may generate the low digital code LDC by performing the time-to-digital conversion on the length of the second pulse signal PS2 based on the first unit delay UD1.

Figure 7:
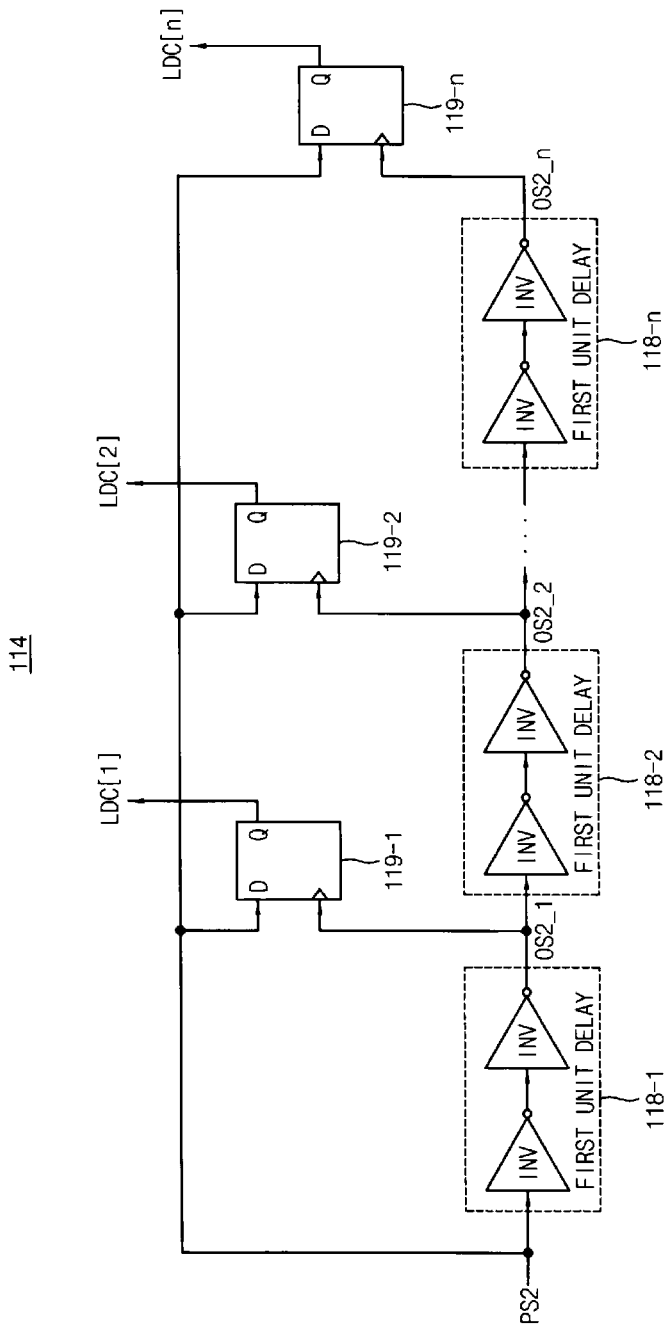
FIG. 7 is a circuit diagram illustrating an example of a second coarse time-to-digital converter included in the first digital code generator of FIG. 4.

FIG. 7 is a circuit diagram illustrating an example of a second coarse time-to-digital converter included in the first digital code generator of FIG. 4.

Referring to FIG. 7, the second coarse time-to-digital converter 114 may include first through n-th delay circuits 118-1, 118-2, . . . , 118-n and first through n-th flip-flops 119-1, 119-2, . . . , 119-n.

The first through n-th delay circuits 118-1, 118-2, . . . , 118-n may be coupled in series. For example, an output signal of the k-th delay circuit 118-k may be provided as an input signal of the (k+1)-th delay circuit 118-(k+1). The second pulse signal PS2 generated by the second pulse generator 113 may be provided as an input signal of the first delay circuit 118-1.

Each of the first through n-th delay circuits 118-1, 118-2, ..., 118-n may generate the output signal by delaying the input signal by the first unit delay UD1. The output signals of the first through n-th delay circuits 118-1, 118-2, ..., 118-n may be referred to as first through n-th output signals OS2_1, OS2_2, ..., OS2_n, respectively.

In some example embodiments, as illustrated in FIG. 7, each of the first through n-th delay circuits 118-1, 118-2, ..., 118-n may include an even number of inverters INV.

The first through n-th flip-flops 119-1, 119-2, ..., 119-n may latch the second pulse signal PS2 in synchronization with a rising edge of the first through n-th output signals OS2_1, OS2_2, ..., OS2_n, respectively, and output the latched signals as first through n-th bit data LDC[1], LDC[2], ..., LDC[n], respectively.

The low digital code LDC output by the second coarse time-to-digital converter 114 may include the first through n-th bit data LDC[1], LDC[2], ..., LDC[n]. For example, the first bit data LDC[1], which is output by the first flip-flop 119-1, may correspond to a first bit of the low digital code LDC, the second bit data LDC[2], which is output by the second flip-flop 119-2, may correspond to a second bit of the low digital code LDC, and the n-th bit data LDC[n], which is output by the n-th flip-flop 119-n, may correspond to an n-th bit of the low digital code LDC.

Figure 8:
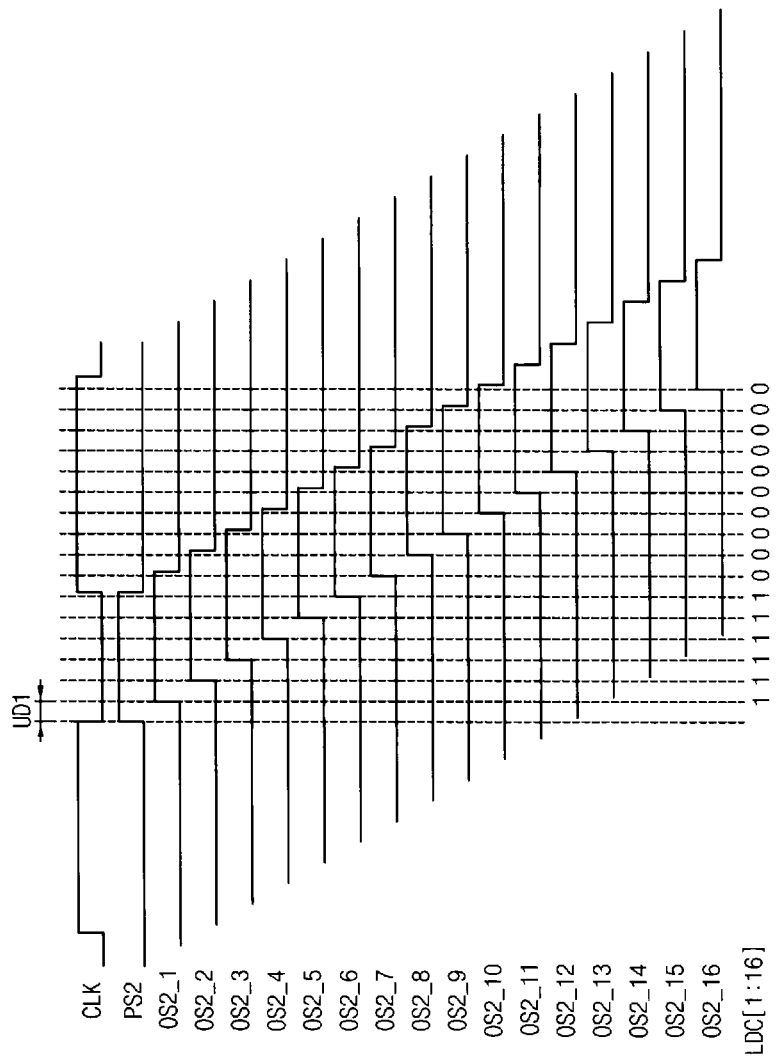
FIG. 8 is a diagram for describing an exemplary operation of the second coarse time-to-digital converter of FIG. 7.

FIG. 8 is a diagram for describing an operation of the second coarse time-to-digital converter of FIG. 7.

In FIG. 8, an operation of the second coarse time-to-digital converter 114 in the case that n is 16 is illustrated as an example.

As illustrated in FIG. 8, since the second pulse signal PS2, which has a high level length corresponding to the length of the low level period of the clock signal CLK, is provided as the input signal of the first delay circuit 118-1, the first through n-th delay circuits 118-1, 118-2, ..., 118-n may generate the first through n-th output signals OS2_1, OS2_2, ..., OS2_n, respectively, by consecutively delaying the second pulse signal PS2 by the first unit delay UD1.

As described above, the first through n-th flip-flops 119-1, 119-2, ..., 119-n may latch the second pulse signal PS2 in synchronization with a rising edge of the first through n-th output signals OS2_1, OS2_2, ..., OS2_n, respectively, and output the latched signals as first through n-th bit data LDC[1], LDC[2], ..., LDC[n], respectively.

Therefore, referring to FIG. 8, since the second pulse signal PS2 is in a high logic level at a rising edge of each of the first through sixth output signals OS2_1, OS2_2, ..., OS2_6, the first through sixth bit data LDC[1], LDC[2], ..., LDC[6], which are output by the first through sixth flip-flops 119-1, 119-2, ..., 119-6, respectively, may have a high logic level. On the other hand, since the second pulse signal PS2 is in a low logic level at a rising edge of each of the seventh through sixteenth output signals OS2_7, OS2_8, ..., OS2_16, the seventh through sixteenth bit data LDC[7], LDC[8], ..., LDC[16], which are output by the seventh through sixteenth flip-flops 119-7, 119-8, ..., 119-16, respectively, may have a low logic level.

Therefore, the second coarse time-to-digital converter 114 may output "1111110000000000" as the low digital code LDC. As such, the number of "1s" included in the low digital code LDC may be proportional to the length of the high level period of the second pulse signal PS2 and thus proportional to the length of the low level period of the clock signal CLK.

Although a structure and an operation of the second coarse time-to-digital converter 114 are described above with reference to FIGS. 7 and 8, example embodiments are not limited thereto. The second coarse time-to-digital converter 114 may be implemented by any structure that is able to convert the length of the pulse of the second pulse signal PS2 into a digital value.

Referring again to FIG. 4, the coarse controller 115 may receive the high digital code HDC from the first coarse time-to-digital converter 112 and receive the low digital code LDC from the second coarse time-to-digital converter 114. The coarse controller 115 may determine which, among the high level period of the clock signal CLK and the low level period of the clock signal CLK, is the longer period of time and which is the shorter period of time, based on the high digital code HDC and the low digital code LDC. For example, the coarse controller 115 may determine that the high level period of the clock signal CLK is longer than the low level period of the clock signal CLK when the number of "1s" included in the high digital code HDC is greater than the number of "1s" included in the low digital code LDC. On the other hand, the coarse controller 115 may determine that the low level period of the clock signal CLK is longer than the high level period of the clock signal CLK when the number of "1s" included in the low digital code LDC is greater than the number of "1s" included in the high digital code HDC.

The coarse controller 115 may output the sign signal SS having a logic level corresponding to the longer period of the clock signal CLK. For example, in certain embodiments, if the high level period of the clock signal CLK is longer, then the sign signal SS may have a high logic level and if the low level period of the clock signal CLK is longer, then the sign signal SS may have a low logic level. The coarse controller 115 may also output one of the high digital code HDC and the low digital code LDC, which corresponds to the shorter period of the clock signal CLK, as the first digital code DC1. In case the high digital code HDC and the low digital code LDC are equal to each other, then the first digital code DC1 may be output as either the high digital code HDC or the low digital code LDC.

Figure 9:
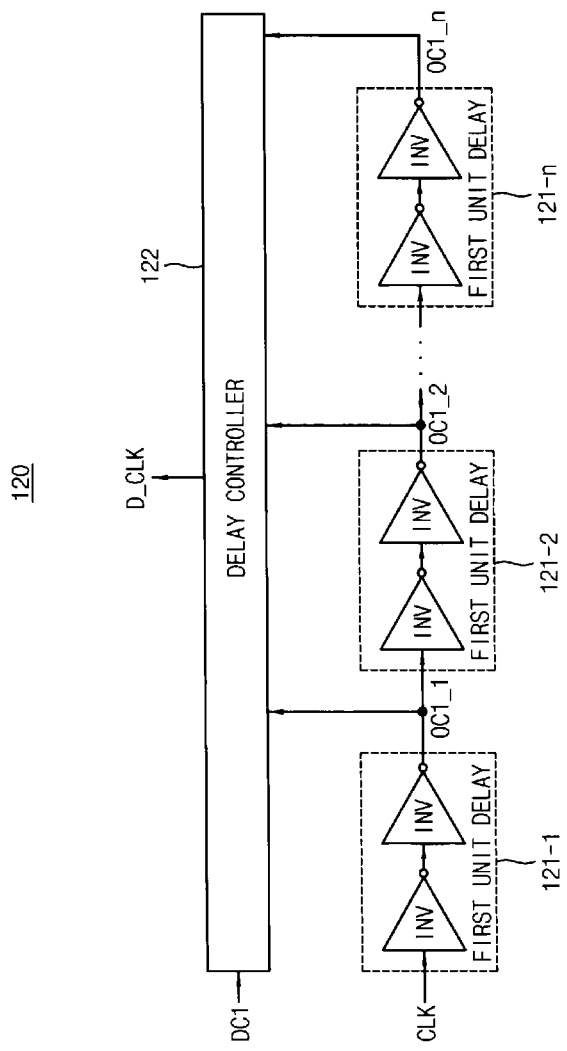
FIG. 9 is a block diagram illustrating an example of a clock delay circuit included in the first duty cycle correction circuit of FIG. 3.

FIG. 9 is a block diagram illustrating an example of a clock delay circuit included in the first duty cycle correction circuit of FIG. 3.

Referring to FIG. 9, the clock delay circuit 120 may include first through n-th delay circuits 121-1, 121-2, ..., 121-n and a delay controller 122.

The first through n-th delay circuits 121-1, 121-2, ..., 121-n may be coupled in series. For example, an output signal of the k-th delay circuit 121-k may be provided as an input signal of the (k+1)-th delay circuit 121-(k+1). The clock signal CLK may be provided as an input signal of the first delay circuit 121-1.

Each of the first through n-th delay circuits 121-1, 121-2, ..., 121-n may generate the output signal by delaying the input signal by the first unit delay UD1. The output signals of the first through n-th delay circuits 121-1, 121-2, ..., 121-n may be referred to as first through n-th output signals OC1_1, OC1_2, ..., OC1_n, respectively.

In some example embodiments, as illustrated in FIG. 9, each of the first through n-th delay circuits 121-1, 121-2, ..., 121-n may include an even number of inverters.

The delay controller 122 may output one of the first through n-th output signals OC1_1, OC1_2, ..., OC1_n, which are received from the first through n-th delay circuits 121-1, 121-2, ..., 121-n, as the delayed clock signal D_CLK based on the first digital code DC1 received from the first digital code generator 110.

For example, when the number of "1s" included in the first digital code DC1 is x, the delay controller 122 may output the x-th output signal OC1_x, which is received from the x-th delay circuit 121-x, as the delayed clock signal D_CLK.

Figure 10:
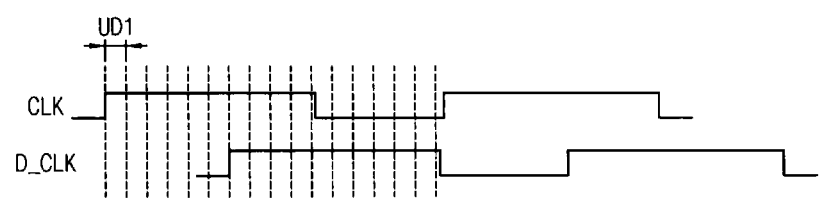
FIG. 10 is a diagram for describing an exemplary operation of the clock delay circuit of FIG. 9.

FIG. 10 is a diagram for describing an operation of the clock delay circuit of FIG. 9.

The clock signal CLK illustrated in FIG. 10 is the same as the clock signal CLK illustrated in FIGS. 6 and 8.

In this example, the first digital code DC1, which is provided to the clock delay circuit 120 by the first digital code generator 110, may be "1111110000000000" corresponding to the low digital code LDC.

Since the number of "1s" included in the first digital code DC1 is six, as illustrated in FIG. 10, the delayed clock signal D_CLK output from the clock delay circuit 120 may correspond to a version of the clock signal CLK delayed by six times the first unit delay UD1.

Although a structure and an operation of the clock delay circuit 120 are described above with reference to FIGS. 9 and 10, example embodiments are not limited thereto. The clock delay circuit 120 may be implemented by any structure that is able to generate the delayed clock signal D_CLK by delaying the clock signal CLK for a time corresponding to the first digital code DC1.

Figure 11:
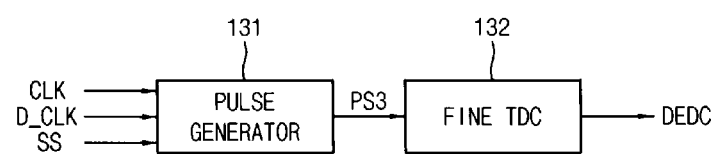
FIG. 11 is a block diagram illustrating an example of a second digital code generator included in the first duty cycle correction circuit of FIG. 3.

FIG. 11 is a block diagram illustrating an example of a second digital code generator included in the first duty cycle correction circuit of FIG. 3.

Referring to FIG. 11, the second digital code generator 130 may include a pulse generator 131 and a fine time-to-digital converter (TDC) 132.

The pulse generator 131 may receive the clock signal CLK, the delayed clock signal D_CLK and the sign signal SS. The pulse generator 131 may determine whether the high level period of the clock signal CLK is longer than the low level period of the clock signal CLK, or vice versa, based on the logic level of the sign signal SS received from the first digital code generator 110. The pulse generator 131 may generate a third pulse signal PS3 having a length corresponding to the length from the start of the longer period of the delay clock signal D_CLK to the end of the longer period of the clock signal CLK. For example, the pulse generator 131 may generate the third pulse signal PS3 having a pulse length corresponding to a length from the rising edge of the delayed clock signal D_CLK to the falling edge of the clock signal CLK when the high level period of the clock signal CLK is longer than the low level period of the clock signal CLK and having a pulse length corresponding to a length from the falling edge of the delayed clock signal D_CLK to the rising edge of the clock signal CLK when the low level period of the clock signal CLK is longer than the high level period of the clock signal CLK.

Figure 12:
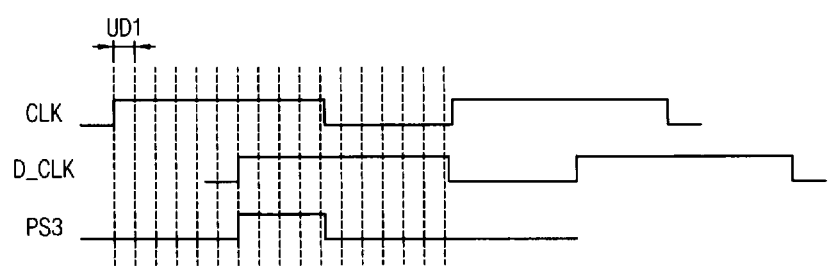
FIG. 12 is a diagram for describing an exemplary operation of a pulse generator included in the second digital code generator of FIG. 11.

FIG. 12 is a diagram for describing an operation of a pulse generator included in the second digital code generator of FIG. 11.

The clock signal CLK and the delayed clock signal D_CLK illustrated in FIG. 12 are the same as the clock signal CLK and the delayed clock signal D_CLK illustrated in FIG. 10.

In this example, the high level period of the clock signal CLK and the delayed clock signal D_CLK may correspond to the longer period. Therefore, as illustrated in FIG. 12, the pulse generator 131 may generate the third pulse signal PS3 having a length corresponding to the length from a start of the high level period of the delayed clock signal D_CLK to an end of the high level period of the clock signal CLK.

Referring again to FIG. 11, the fine time-to-digital converter 132 may generate the duty error digital code DEDC by performing the time-to-digital conversion on the length of the third pulse signal PS3 based on the second unit delay UD2, which is smaller than the first unit delay UD1.

Figure 13:
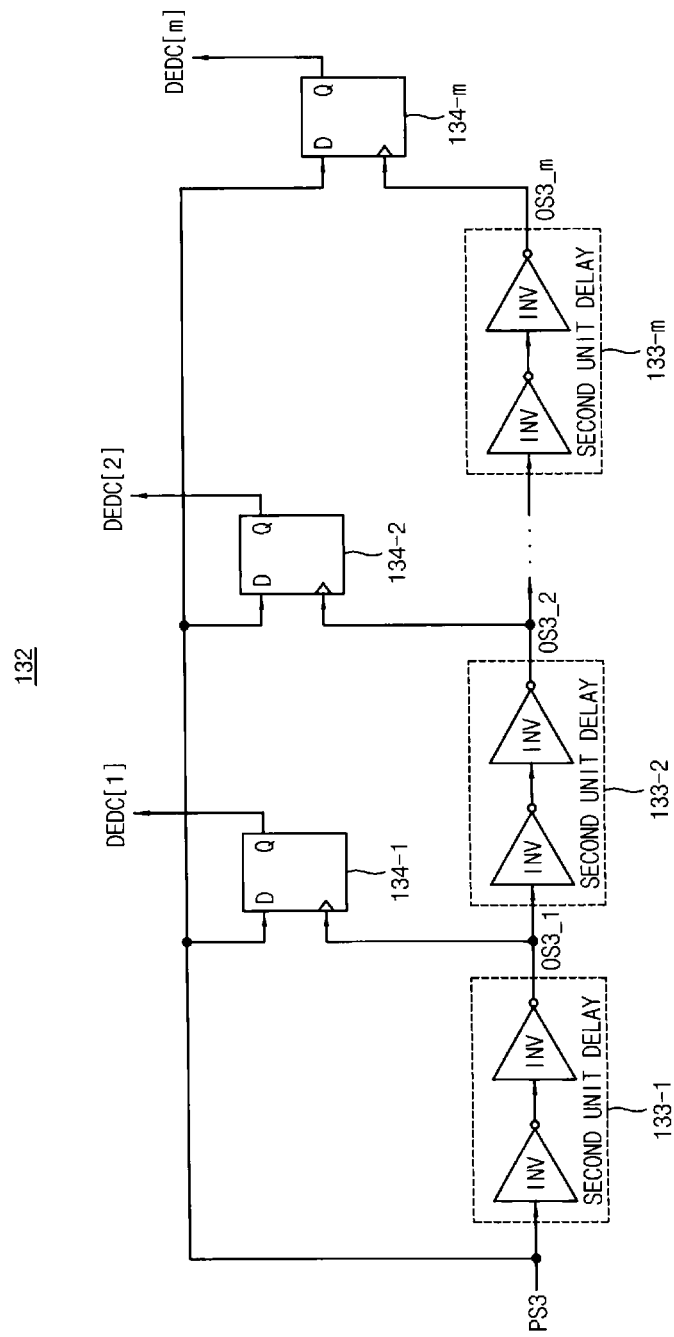
FIG. 13 is a circuit diagram illustrating an example of a fine time-to-digital converter included in the second digital code generator of FIG. 11.

FIG. 13 is a circuit diagram illustrating an example of a fine time-to-digital converter included in the second digital code generator of FIG. 11.

Referring to FIG. 13, the fine time-to-digital converter 132 may include first through m-th delay circuits 133-1, 133-2, . . . , 133-m and first through m-th flip-flops 134-1, 134-2, . . . , 134-m, where m represents an integer equal to or greater than two.

The first through m-th delay circuits 133-1, 133-2, . . . , 133-m may be coupled in series. For example, an output signal of the s-th delay circuit 133-s may be provided as an input signal of the (s+1)-th delay circuit 133-(s+1), where s represents a positive integer equal to or smaller than (m−1). The third pulse signal PS3 generated by the pulse generator 131 may be provided as an input signal of the first delay circuit 133-1.

Each of the first through m-th delay circuits 133-1, 133-2, . . . , 133-m may generate the output signal by delaying the input signal by the second unit delay UD2. The output signals of the first through m-th delay circuits 133-1, 133-2, . . . , 133-m may be referred to as first through m-th output signals OS3_1, OS3_2, . . . , OS3_m, respectively.

In some example embodiments, as illustrated in FIG. 13, each of the first through m-th delay circuits 133-1, 133-2, . . . , 133-n may include an even number of inverters INV. In certain embodiments, the inverters INV in the delay circuits 116, 118, and 121 used to create the first unit delay may be different than the inverters INV in the delay circuit 133 used to create the second unit delay. For example, a number of inverters, a size of the inverters, or other factors may be different, to cause the different unit delay UD2.

The first through m-th flip-flops 134-1, 134-2, . . . , 134-m may latch the third pulse signal PS3 in synchronization with a rising edge of the first through m-th output signals OS3_1, OS3_2, . . . , OS3_m, respectively, and output the latched signals as first through m-th bit data DEDC[1], DEDC[2], . . . , DEDC[m], respectively.

The duty error digital code DEDC output by the fine time-to-digital converter 132 may include the first through m-th bit data DEDC[1], DEDC[2], . . . , DEDC[m]. For example, the first bit data DEDC[1], which is output by the first flip-flop 134-1, may correspond to a first bit of the duty error digital code DEDC, the second bit data DEDC[2], which is output by the second flip-flop 134-2, may correspond to a second bit of the duty error digital code DEDC, and the m-th bit data DEDC[m], which is output by the m-th flip-flop 134-m, may correspond to an m-th bit of the duty error digital code DEDC.

Figure 14:
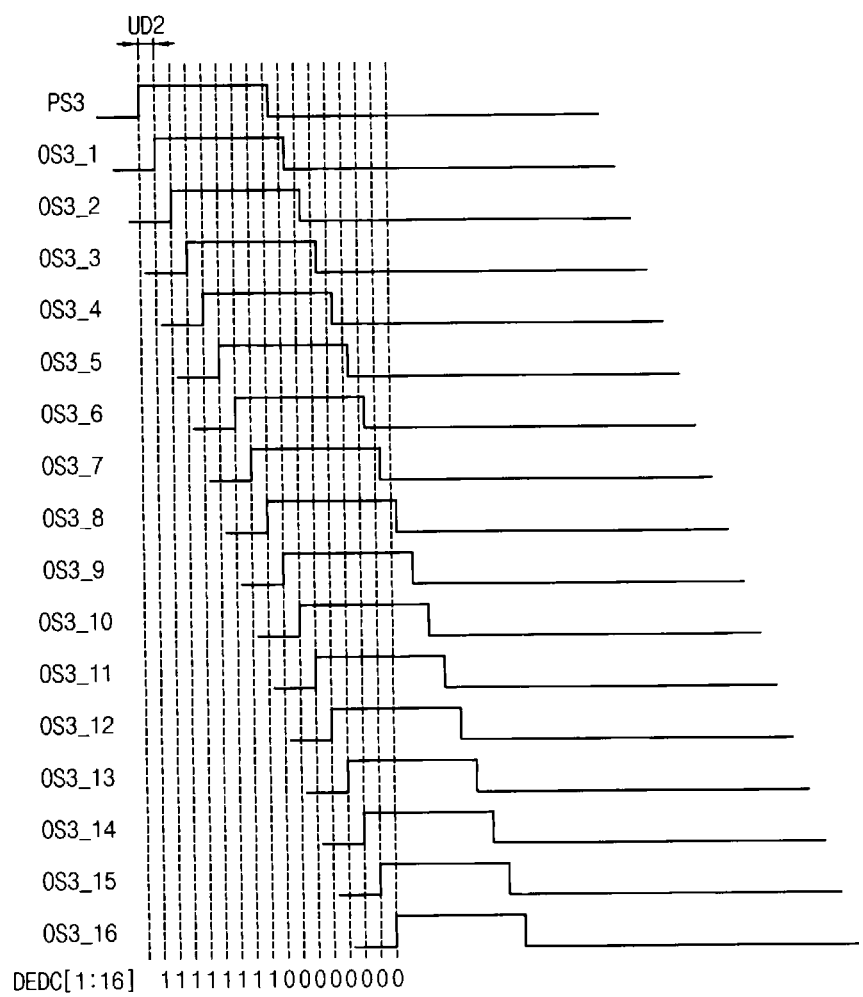
FIG. 14 is a diagram for describing an exemplary operation of the fine time-to-digital converter of FIG. 13.

FIG. 14 is a diagram for describing an operation of the fine time-to-digital converter of FIG. 13.

In FIG. 14, an operation of the fine time-to-digital converter 132 in the case that m is 16 is illustrated as an example.

As illustrated in FIG. 14, since the third pulse signal PS3 is provided as the input signal of the first delay circuit 133-1, the first through m-th delay circuits 133-1, 133-2, . . . , 133-m may generate the first through m-th output signals OS3_1, OS3_2, . . . , OS3_m, respectively, by consecutively delaying the third pulse signal PS3 by the second unit delay UD2.

As described above, the first through m-th flip-flops 134-1, 134-2, . . . , 134-m may latch the third pulse signal PS3 in synchronization with a rising edge of the first through m-th output signals OS3_1, OS3_2, . . . , OS3_m, respectively, and output the latched signals as first through m-th bit data DEDC[1], DEDC[2], . . . , DEDC[m], respectively.

Therefore, referring to FIG. 14, since the third pulse signal PS3 is in a high logic level at a rising edge of each of the first through eighth output signals OS3_1, OS3_2, . . . , OS3_8, the first through eighth bit data DEDC[1], DEDC[2], . . . , DEDC[8], which are output by the first through eighth flip-flops 134-1, 134-2, . . . , 134-8, respectively, may have a logic high level. On the other hand, since the third pulse signal PS3 is in a logic low level at a rising edge of each of the ninth through sixteenth output signals OS3_9, OS3_10, . . . , OS3_16, the ninth through sixteenth bit data DEDC[9], DEDC[10], . . . , DEDC[16], which are output by the ninth through sixteenth flip-flops 134-9, 134-10, . . . , 134-16, respectively, may have a low logic level.

Therefore, the fine time-to-digital converter 132 may output "1111111100000000" as the duty error digital code DEDC. As such, the number of "1s" included in the duty error digital code DEDC may be proportional to the pulse length of the third pulse signal PS3. The third pulse signal PS3 illustrated in FIG. 14 may have the same duration as the third pulse signal PS3 illustrated in FIG. 12. The second unit delay UD2, being less than the first unit delay UD1, allows for more unit delay periods during the pulse as shown in FIG. 14 as compared with FIG. 12 (e.g., twice as many as depicted in FIG. 14).

Although a structure and an operation of the fine time-to-digital converter 132 are described above with reference to FIGS. 13 and 14, example embodiments are not limited thereto. The fine time-to-digital converter 132 may be implemented by any structure that is able to convert the length of the third pulse signal PS3 into a digital value.

As described above with reference to FIGS. 3 to 14, the first digital code generator 110 may generate the high digital code HDC and the low digital code LDC by performing the time-to-digital conversion on the length of the high level period of the clock signal CLK and the length of the low level period of the clock signal CLK, respectively, based on the first unit delay UD1, and the clock delay circuit 120 may generate the delayed clock signal D_CLK by delaying the clock signal CLK for a time period corresponding to the first digital code DC1, which corresponds to a smaller one between the high digital code HDC and the low digital code LDC. Therefore, the length of time from the start (rising edge or falling edge) of the longer period of the delayed clock signal D_CLK (longer high level or longer low level) to the end (falling edge or rising edge) of the longer period of the clock signal CLK (longer high level or longer low level) may correspond to the duty cycle error of the clock signal CLK. The second digital code generator 130 may generate the duty error digital code DEDC by performing the time-to-digital conversion on the length from the start of the longer period of the delayed clock signal D_CLK to the end of the longer period of the clock signal CLK more precisely, based on the second unit delay UD2, which is smaller than the first unit delay UD1. As such, the duty cycle error detection circuit 100 may generate the duty error digital code DEDC more precisely in representing the duty cycle error of the clock signal CLK.

Figure 15:
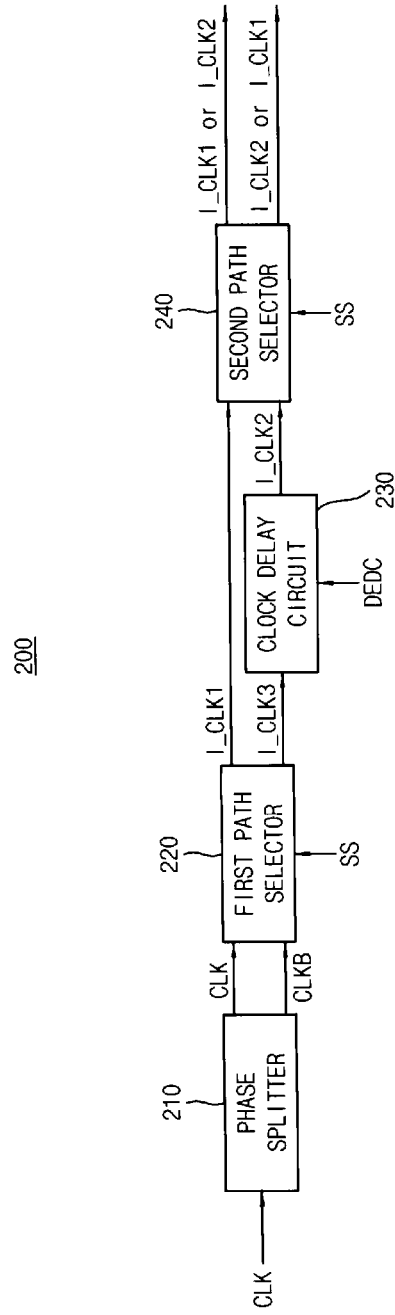
FIG. 15 is a block diagram illustrating an example of a phase align circuit included in the first duty cycle correction circuit of FIG. 2.

FIG. 15 is a block diagram illustrating an example of a phase align circuit included in the first duty cycle correction circuit of FIG. 2.

Referring to FIG. 15, the phase align circuit 200 may include a phase splitter 210, a first path selector 220, a clock delay circuit 230 and a second path selector 240.

The phase splitter 210 may receive the clock signal CLK. The phase splitter 210 may generate the inverted clock signal CLKB by inverting the clock signal CLK, and output the clock signal CLK and the inverted clock signal CLKB in synchronization with each other.

The first path selector 220 may receive the clock signal CLK and the inverted clock signal CLKB from the phase splitter 210. The first path selector 220 may output one of the clock signal CLK and the inverted clock signal CLKB through a first output electrode as the first internal clock signal I_CLK1, and output the other one of the clock signal CLK and the inverted clock signal CLKB through a second output electrode as a third internal clock signal I_CLK3 based on the logic level of the sign signal SS.

As described above, the duty cycle error detection circuit 100 may generate the sign signal SS having the first logic level when the high level period of the clock signal CLK is longer than the low level period of the clock signal CLK, and generate the sign signal SS having the second logic level when the low level period of the clock signal CLK is longer than the high level period of the clock signal CLK.

Therefore, when the sign signal SS has the first logic level, the first path selector 220 may determine that the high level period of the clock signal CLK is longer than the low level period of the clock signal CLK. In this case, the first path selector 220 may output the inverted clock signal CLKB through the first output electrode as the first internal clock signal I_CLK1, and output the clock signal CLK through the second output electrode as the third internal clock signal I_CLK3.

On the other hand, when the sign signal SS has the second logic level, the first path selector 220 may determine that the low level period of the clock signal CLK is longer than the high level period of the clock signal CLK. In this case, the first path selector 220 may output the clock signal CLK through the first output electrode as the first internal clock signal I_CLK1, and output the inverted clock signal CLKB through the second output electrode as the third internal clock signal I_CLK3.

The clock delay circuit 230 may generate the second internal clock signal I_CLK2 by delaying the third internal clock signal I_CLK3 for a time corresponding to a half of the duty error digital code DEDC.

In some example embodiments, the clock delay circuit 230 may generate the second internal clock signal I_CLK2 by delaying the third internal clock signal I_CLK3 by a delay time generated by performing the digital-to-time conversion on the half of the duty error digital code DEDC based on the second unit delay UD2.

Figure 16:
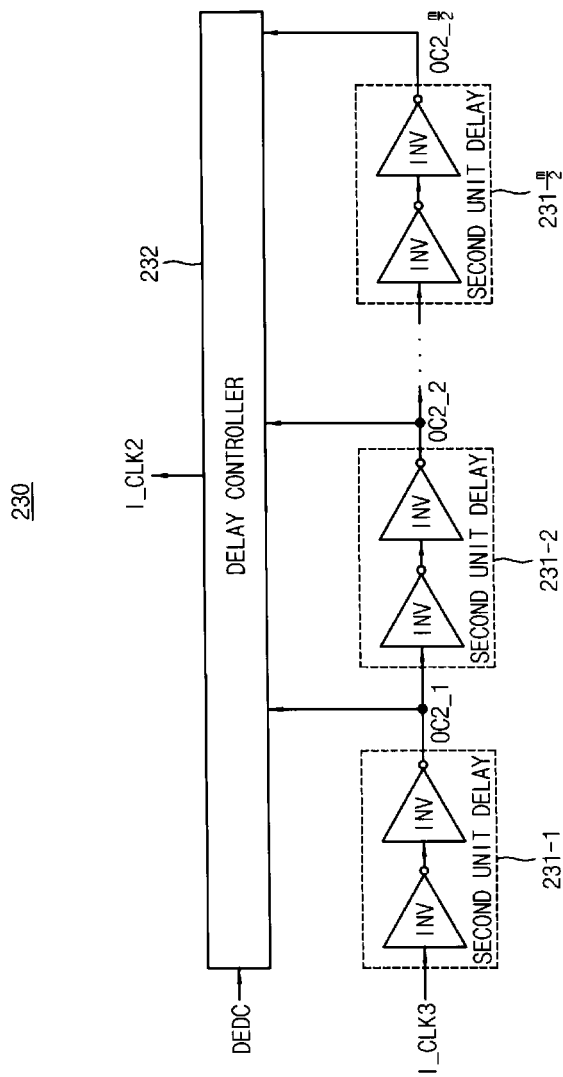
FIG. 16 is a block diagram illustrating an example of a clock delay circuit included in the phase align circuit of FIG. 15.

FIG. 16 is a block diagram illustrating an example of a clock delay circuit included in the phase align circuit of FIG. 15.

Referring to FIG. 16, the clock delay circuit 230 may include first through (m/2)-th delay circuits 231-1, 231-2, . . . , 231-(m/2) and a delay controller 232.

Since the clock delay circuit 230 generates the second internal clock signal I_CLK2 by delaying the third internal clock signal I_CLK3 for a time corresponding to a half of the duty error digital code DEDC, the number of the delay circuits included in the clock delay circuit 230 may be a half of the number of the delay circuits included in the fine time-to-digital converter 132 of the second digital code generator 130, which generates the duty error digital code DEDC.

The first through (m/2)-th delay circuits 231-1, 231-2, ..., 231-(m/2) may be coupled in series. For example, an output signal of the t-th delay circuit 231-t may be provided as an input signal of the (t+1)-th delay circuit 231-(t+1). Here, t represents a positive integer equal to or smaller than (m/2−1). The third internal clock signal I_CLK3 may be provided as an input signal of the first delay circuit 231-1.

Each of the first through (m/2)-th delay circuits 231-1, 231-2, ..., 231-(m/2) may generate the output signal by delaying the input signal by the second unit delay UD2. The output signals of the first through (m/2)-th delay circuits 231-1, 231-2, ..., 231-(m/2) may be referred to as first through (m/2)-th output signals OC2_1, OC2_2, ..., OC2_(m/2), respectively.

In some example embodiments, as illustrated in FIG. 16, each of the first through (m/2)-th delay circuits 231-1, 231-2, ..., 231-(m/2) may include an even number of inverters INV.

The delay controller 232 may output one of the first through (m/2)-th output signals 0C2_1, OC2_2, ..., OC2_(m/2), which are received from the first through (m/2)-th delay circuits 231-1, 231-2, ..., 231-(m/2), as the second internal clock signal I_CLK2 based on a half of the duty error digital code DEDC.

For example, when the number of "1s" included in the duty error digital code DEDC is y, the delay controller 232 may output the (y/2)-th output signal OC2 (y/2), which is received from the (y/2)-th delay circuit 231-(y/2), as the second internal clock signal I_CLK2.

Referring again to FIG. 15, the second path selector 240 may receive the first internal clock signal I_CLK1 from the first path selector 220, and receive the second internal clock signal I_CLK2 from the clock delay circuit 230. The second path selector 240 may output one of the first internal clock signal I_CLK1 and the second internal clock signal I_CLK2 through a first output electrode, and output the other one of the first internal clock signal I_CLK1 and the second internal clock signal I_CLK2 through a second output electrode based on the logic level of the sign signal SS.

As described above, the duty cycle error detection circuit 100 may generate the sign signal SS having the first logic level when the high level period of the clock signal CLK is longer than the low level period of the clock signal CLK, and generate the sign signal SS having the second logic level when the low level period of the clock signal CLK is longer than the high level period of the clock signal CLK.

Therefore, when the sign signal SS has the first logic level, the second path selector 240 may determine that the high level period of the clock signal CLK is longer than the low level period of the clock signal CLK. In this case, the second path selector 240 may output the second internal clock signal I_CLK2 through the first output electrode, and output the first internal clock signal I_CLK1 through the second output electrode.

On the other hand, when the sign signal SS has the second logic level, the second path selector 240 may determine that the low level period of the clock signal CLK is longer than the high level period of the clock signal CLK. In this case, the second path selector 240 may output the first internal clock signal I_CLK1 through the first output electrode, and output the second internal clock signal I_CLK2 through the second output electrode.

Figure 17:
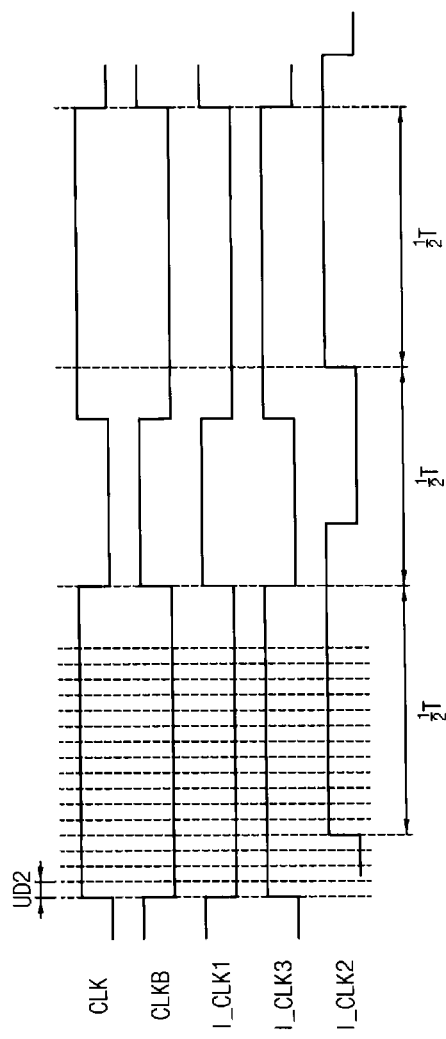
FIG. 17 is a diagram for describing an exemplary operation of the phase align circuit of FIG. 15.

FIG. 17 is a diagram for describing an exemplary operation of the phase align circuit of FIG. 15.

The clock signal CLK illustrated in FIG. 17 is the same as the clock signal CLK illustrated in FIG. 12.

As described above in exemplary embodiments with reference to FIGS. 11 to 14, the duty error digital code DEDC, which is provided to the clock delay circuit 230 by the duty cycle error detection circuit 100, may be "1111111100000000".

The first path selector 220 may determine that the high level period of the clock signal CLK is longer than the low level period of the clock signal CLK based on the logic level of the sign signal SS. Therefore, as illustrated in FIG. 17, the first path selector 220 may output the inverted clock signal CLKB through the first output electrode as the first internal clock signal I_CLK1, and output the clock signal CLK through the second output electrode as the third internal clock signal I_CLK3.

Since the number of "1s" included in the duty error digital code DEDC is eight, the number of "1s" included in a half of the duty error digital code DEDC may be four. Therefore, as illustrated in FIG. 17, the second internal clock signal I CLK2 output from the clock delay circuit 230 may correspond to a version of the third internal clock signal I_CLK3 delayed by four times the second unit delay UD2.

As illustrated in FIG. 17, a length between a rising edge of the first internal clock signal I_CLK1 and a rising edge of the second internal clock signal I_CLK2 may correspond to half of a period T of the clock signal CLK.

Figure 18:
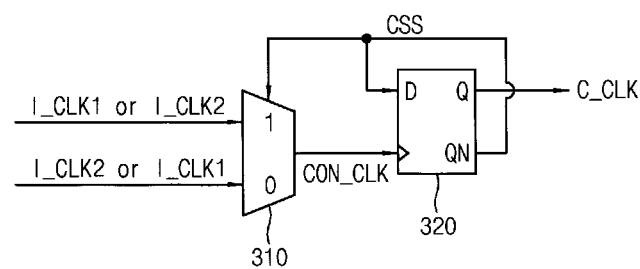
FIG. 18 is a block diagram illustrating an example of a clock synthesis circuit included in the first duty cycle correction circuit of FIG. 2.

FIG. 18 is a block diagram illustrating an example of a clock synthesis circuit included in the first duty cycle correction circuit of FIG. 2.

Referring to FIG. 18, a clock synthesis circuit 300a may include a multiplexer 310 and a flip-flop 320.

The multiplexer 310 may receive the first internal clock signal I_CLK1 and the second internal clock signal I_CLK2 from the first output electrode and the second output electrode of the second path selector 240.

As described above, when the high level period of the clock signal CLK is longer than the low level period of the clock signal CLK, the multiplexer 310 may receive the second internal clock signal I_CLK2 from the first output electrode of the second path selector 240, and receive the first internal clock signal I_CLK1 from the second output electrode of the second path selector 240. On the other hand, when the low level period of the clock signal CLK is longer than the high level period of the clock signal CLK, the multiplexer 310 may receive the first internal clock signal I_CLK1 from the first output electrode of the second path selector 240, and receive the second internal clock signal I_CLK2 from the second output electrode of the second path selector 240.

The multiplexer 310 may output one of the first internal clock signal I_CLK1 and the second internal clock signal I_CLK2 as a control clock signal CON_CLK in response to a clock selection signal CSS, which is provided by the flip-flop 320. For example, the multiplexer 310 may output a clock signal received from the first output electrode of the second path selector 240 as the control clock signal CON_CLK when the clock selection signal CSS has a high logic level ("1"), and output a clock signal received from the second output electrode of the second path selector 240 as the control clock signal CON_CLK when the clock selection signal CSS has a low logic level ("0").

The flip-flop 320 may latch the clock selection signal CSS in synchronization with a rising edge of the control clock signal CON_CLK. The flip-flop 320 may output the latched signal as the corrected clock signal C_CLK, and output an inverted version of the corrected clock signal C_CLK as the clock selection signal CSS. Since the clock selection signal CSS toggles at each rising edge of the control clock signal CON_CLK, the multiplexer 310 may alternately output the first internal clock signal I_CLK1 and the second internal clock signal I_CLK2 as the control clock signal CON_CLK at each rising edge of the first internal clock signal I_CLK1 and each rising edge of the second internal clock signal I_CLK2. Therefore, the corrected clock signal C_CLK output from the flip-flop 320 may toggle at each rising edge of the first internal clock signal I_CLK1 and each rising edge of the second internal clock signal I_CLK2.

As described above, the length between a rising edge of the first internal clock signal I_CLK1 and a rising edge of the second internal clock signal I_CLK2 may correspond to half of a period T of the clock signal CLK. Therefore, a period of the corrected clock signal C_CLK, which is output from the clock synthesis circuit 300a, may be the same as the period T of the clock signal CLK while a duty ratio of the corrected clock signal C_CLK is 1:1 (e.g., a duty cycle is 50%).

Figure 19:
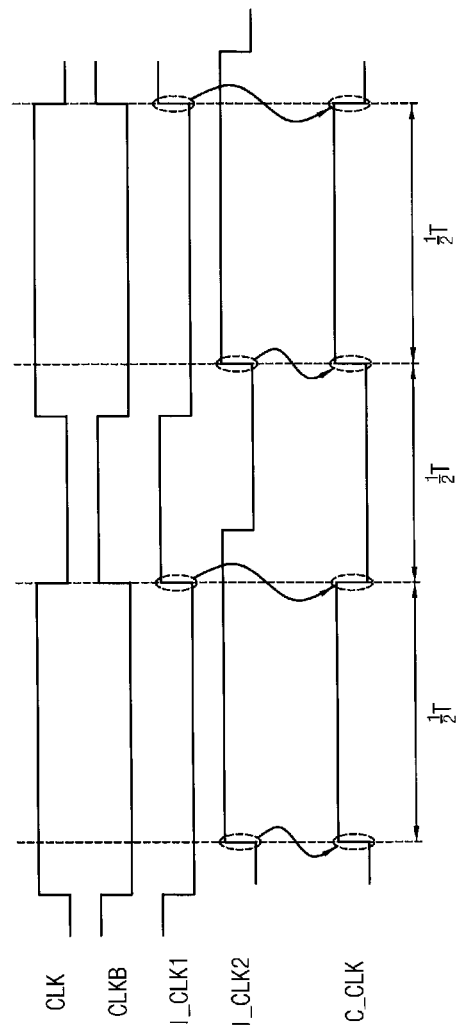
FIG. 19 is a diagram for describing an exemplary operation of the clock synthesis circuit of FIG. 18.

FIG. 19 is a diagram for describing an exemplary operation of the clock synthesis circuit of FIG. 18.

The clock signal CLK, the inverted clock signal CLKB, the first internal clock signal I_CLK1 and the second internal clock signal I_CLK2 illustrated in the example of FIG. 19 are the same as the clock signal CLK, the inverted clock signal CLKB, the first internal clock signal I_CLK1 and the second internal clock signal I_CLK2 illustrated in the example of FIG. 17.

As described above with reference to FIG. 18, the multiplexer 310 may alternately output the first internal clock signal I_CLK1 and the second internal clock signal I_CLK2 as the control clock signal CON_CLK at each rising edge of the first internal clock signal I_CLK1 and each rising edge of the second internal clock signal I_CLK2, and the flip-flop 320 may output the corrected clock signal C_CLK, which toggles at each rising edge of the control clock signal CON_CLK.

Therefore, as illustrated in FIG. 19, the clock synthesis circuit 300a may generate the corrected clock signal C_CLK, which toggles at each rising edge of the first internal clock signal I_CLK1 and each rising edge of the second internal clock signal I_CLK2. As such, as illustrated in FIG. 19, a period of the corrected clock signal C_CLK, which is output from the clock synthesis circuit 300a, may be the same as the period T of the clock signal CLK while a duty cycle of the corrected clock signal C_CLK is 50%.

Figure 20:
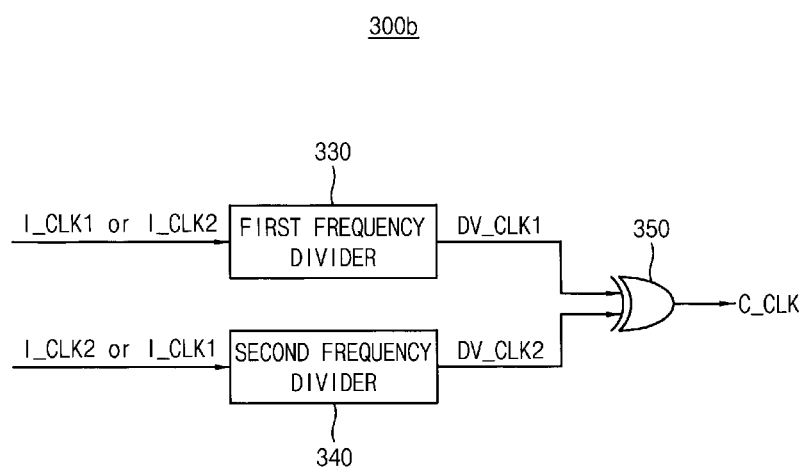
FIG. 20 is a block diagram illustrating an example of a clock synthesis circuit included in the first duty cycle correction circuit of FIG. 2.

FIG. 20 is a block diagram illustrating another example of a clock synthesis circuit included in the first duty cycle correction circuit of FIG. 2.

Referring to FIG. 20, a clock synthesis circuit 300b may include a first frequency divider 330, a second frequency divider 340 and an exclusive OR gate 350.

The first frequency divider 330 may generate a first divided clock signal DV_CLK1, which toggles at each rising edge of one of the first internal clock signal I_CLK1 and the second internal clock signal I_CLK2. Therefore, a period of the first divided clock signal DV_CLK1 may be two times the period T of the clock signal CLK.

The second frequency divider 340 may generate a second divided clock signal DV_CLK2, which toggles at each rising edge of the other one of the first internal clock signal I_CLK1 and the second internal clock signal I_CLK2. Therefore, a period of the second divided clock signal DV_CLK2 may be two times the period T of the clock signal CLK.

In certain embodiments, a phase offset between the first divided clock signal DV_CLK1 and the second divided clock signal DV_CLK2 may be 90 degrees.

The exclusive-OR gate 350 may perform an exclusive-OR (XOR) operation on the first divided clock signal DV_CLK1 and the second divided clock signal DV_CLK2 to generate the corrected clock signal C_CLK.

Figure 21:
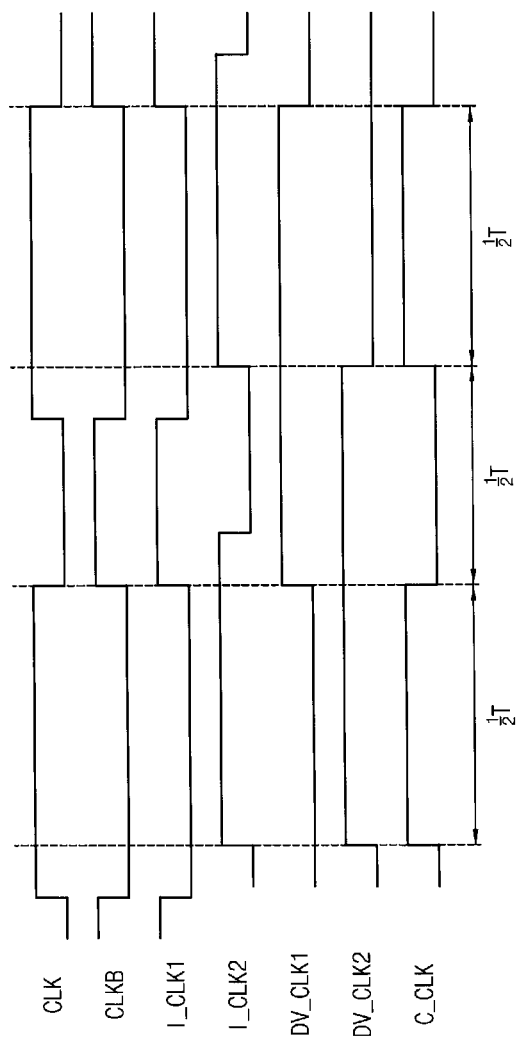
FIG. 21 is a diagram for describing an exemplary operation of the clock synthesis circuit of FIG. 20.

FIG. 21 is a diagram for describing an operation of the clock synthesis circuit of FIG. 20.

The clock signal CLK, the inverted clock signal CLKB, the first internal clock signal I_CLK1 and the second internal clock signal I_CLK2 illustrated in FIG. 21 are the same as the clock signal CLK, the inverted clock signal CLKB, the first internal clock signal I_CLK1 and the second internal clock signal I_CLK2 illustrated in FIG. 17.

As described above with reference to FIG. 20, the first frequency divider 330 may generate the first divided clock signal DV_CLK1, which toggles at each rising edge of the first internal clock signal I_CLK1, and the second frequency divider 340 may generate the second divided clock signal DV_CLK2, which toggles at each rising edge of the second internal clock signal I_CLK2. Therefore, as illustrated in FIG. 21, the first divided clock signal DV_CLK1 and the second divided clock signal DV_CLK2 may have a period corresponding to two times the period T of the clock signal CLK, while a phase period between the first divided clock signal DV_CLK1 and the second divided clock signal DV_CLK2 may be 90 degrees.

Since the exclusive OR gate 350 performs an exclusive OR (XOR) operation on the first divided clock signal DV_CLK1 and the second divided clock signal DV_CLK2 to generate the corrected clock signal C_CLK, as illustrated in FIG. 21, a period of the corrected clock signal C_CLK may be the same as the period T of the clock signal CLK while a duty cycle of the corrected clock signal C_CLK may be 50% (e.g., duty ratio of 1:1).

As described above with reference to FIGS. 2 to 21, the duty cycle error detection circuit 100 may generate the sign signal SS, which represents the longer period between the high level period of the clock signal CLK and the low level period of the clock signal CLK, and generate the duty error digital code DEDC, which corresponds to a difference between the length of the high level period of the clock signal CLK and the length of the low level period of the clock signal CLK, the phase align circuit 200 may output one of the clock signal CLK and the inverted clock signal CLKB as the first internal clock signal I_CLK1 based on the logic level of the sign signal SS, and generate the second internal clock signal I_CLK2 by delaying the other one of the clock signal CLK and the inverted clock signal CLKB for a time corresponding to a half of the duty error digital code DEDC, and the clock synthesis circuit 300 may generate the corrected clock signal C_CLK, which toggles at each rising edge of the first internal clock signal I_CLK1 and each rising edge of the second internal clock signal I_CLK2.

Since the phase align circuit 200 generates the second internal clock signal I_CLK2 by delaying the other one of the clock signal CLK and the inverted clock signal CLKB only for a time corresponding to a half of the difference between the length of the high level period of the clock signal CLK and the length of the low level period of the clock signal CLK not for a whole cycle T of the clock signal CLK, the first duty cycle correction circuit 10 according to example embodiments may be manufactured in a small size while correcting the duty cycle error of the clock signal CLK in a high speed to generate the corrected clock signal C_CLK.

Figure 22:
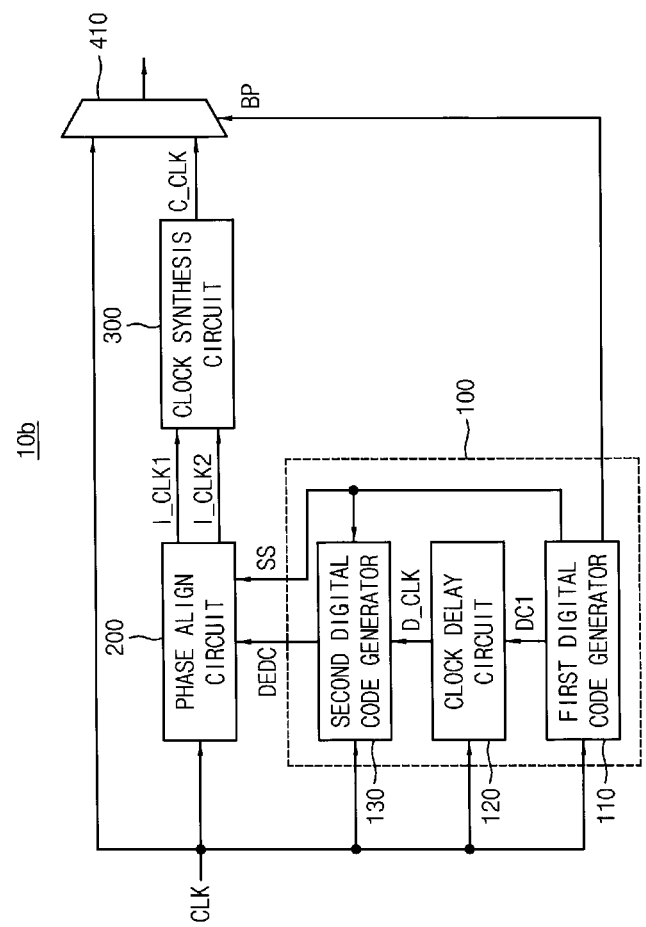
FIG. 22 is a block diagram illustrating an example of the first duty cycle correction circuit of FIG. 2.

FIG. 22 is a block diagram illustrating an example of the first duty cycle correction circuit of FIG. 2.

A first duty cycle correction circuit 10b of FIG. 22 may further include a multiplexer 410 in comparison with the first duty cycle correction circuit 10a of FIG. 3.

The first digital code generator 110 included in the duty cycle error detection circuit 100 may generate a bypass signal BP based on the high digital code HDC and the low digital code LDC.

For example, when the high digital code HDC is different from the low digital code LDC, the first digital code generator 110 may determine that the clock signal CLK has a duty cycle error, and deactivate the bypass signal BP. When the high digital code HDC is identical to the low digital code LDC, the first digital code generator 110 may determine that the clock signal CLK does not have a duty cycle error, and activate the bypass signal BP. It should be noted that such a bypass signal may be used in other embodiments when the high digital code HDC is identical to the low digital code LDC (e.g., when there is no duty cycle error).

The multiplexer 410 may receive the clock signal CLK and the corrected clock signal C_CLK. The multiplexer 410 may output the corrected clock signal C_CLK when the bypass signal BP is deactivated, and output the clock signal CLK when the bypass signal BP is activated. The output signal of the multiplexer 410 may be provided to the delay line 20, depicted in FIG. 1, as the corrected clock signal C_CLK.

Therefore, the first duty cycle correction circuit 10b may provide the corrected clock signal C_CLK to the delay line 20 when the first duty cycle correction circuit 10b determines that the clock signal CLK has a duty cycle error, and provide the clock signal CLK to the delay line 20 as the corrected clock signal C_CLK when the first duty cycle correction circuit 10b determines that the clock signal CLK does not have a duty cycle error. As such, a time duration from a time when the first duty cycle correction circuit 10b receives the clock signal CLK to a time when the delay line 20 receives the corrected clock signal C_CLK from the first duty cycle correction circuit 10b may further decrease.

Figure 23:
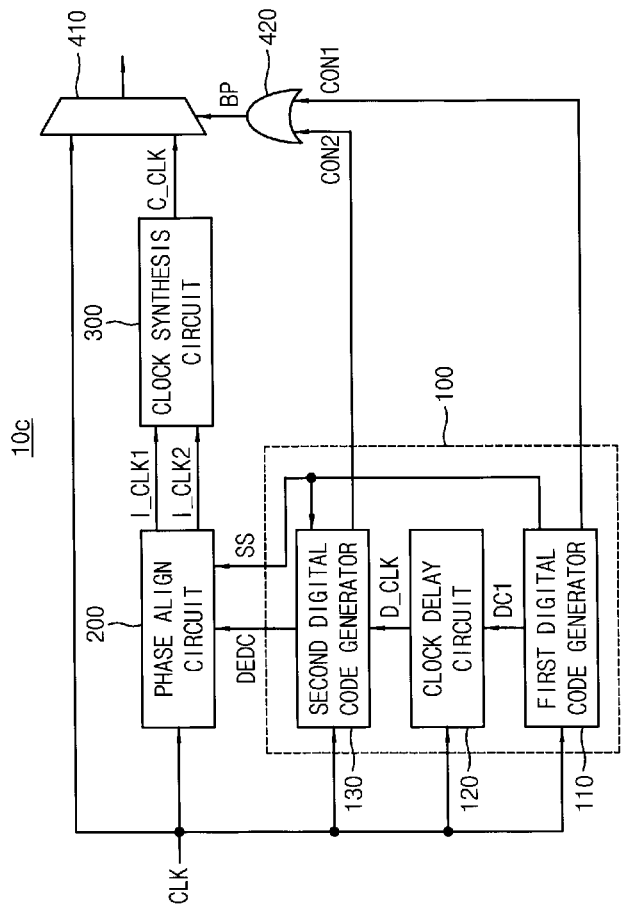
FIG. 23 is a block diagram illustrating an example of the first duty cycle correction circuit of FIG. 2.

FIG. 23 is a block diagram illustrating another example of the first duty cycle correction circuit of FIG. 2.

A first duty cycle correction circuit 10c of FIG. 23 may further include a multiplexer 410 and an OR gate 420 in comparison with the first duty cycle correction circuit 10a of FIG. 3.

The first digital code generator 110 included in the duty cycle error detection circuit 100 may generate a first control signal CON1 based on the high digital code HDC and the low digital code LDC.

For example, when the high digital code HDC is different from the low digital code LDC, the first digital code generator 110 may determine that the clock signal CLK has a duty cycle error, and deactivate the first control signal CON1. On the other hand, when the high digital code HDC is identical to the low digital code LDC, the first digital code generator 110 may determine that the clock signal CLK does not have a duty cycle error, and activate the first control signal CON1.

The second digital code generator 130 included in the duty cycle error detection circuit 100 may generate a second control signal CON2 based on the duty error digital code DEDC and a threshold code. The threshold code may be stored in the second digital code generator 130. The threshold code may indicate, for example, a minimum number of second unit delays for qualifying a clock signal as having a duty cycle needing correction.

For example, when the duty error digital code DEDC is equal to or greater than the threshold code, the second digital code generator 130 may determine that the clock signal CLK has a duty cycle error, and deactivate the second control signal CON2. On the other hand, when the duty error digital code DEDC is smaller than the threshold code, the second digital code generator 130 may determine that the clock signal CLK does not have a duty cycle error, and activate the second control signal CON2.

The OR gate 420 may perform an OR operation on the first control signal CON1 and the second control signal CON2 to generate a bypass signal BP.

The multiplexer 410 may receive the clock signal CLK and the corrected clock signal C_CLK. The multiplexer 410 may output the corrected clock signal C_CLK when the bypass signal BP is deactivated, and output the clock signal CLK when the bypass signal BP is activated. The output signal of the multiplexer 410 may be provided to the delay line 20 as the corrected clock signal C_CLK.

Therefore, the first duty cycle correction circuit 10c may provide the corrected clock signal C_CLK to the delay line 20 when the first duty cycle correction circuit 10c determines that the clock signal CLK has a duty cycle error, and provide the clock signal CLK to the delay line 20 as the corrected clock signal C_CLK when the first duty cycle correction circuit 10c determines that the clock signal CLK does not have a duty cycle error. As such, a time duration from when the first duty cycle correction circuit 10c receives the clock signal CLK to a time when the delay line 20 receives the corrected clock signal C_CLK from the first duty cycle correction circuit 10c may further decrease.

Figure 24:
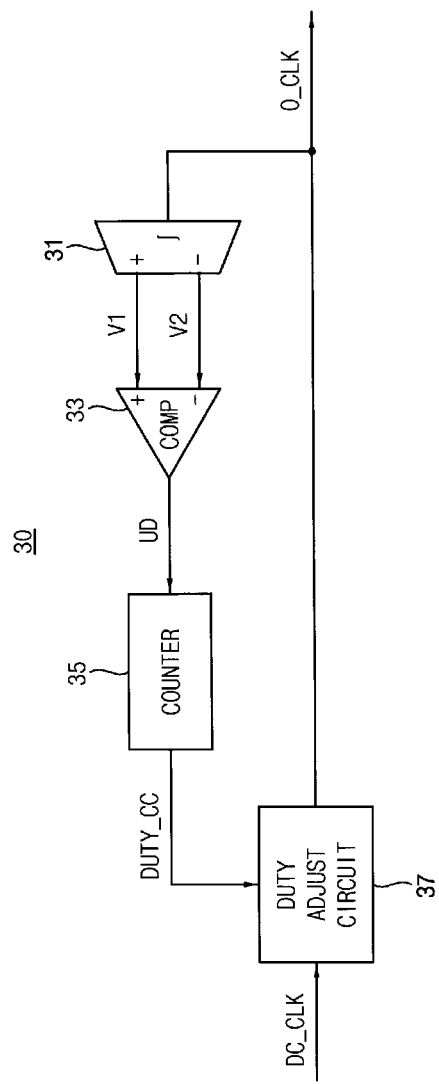
FIG. 24 is a block diagram illustrating an example of a second duty cycle correction circuit included in the delay locked loop of FIG. 1.

FIG. 24 is a block diagram illustrating an example of a second duty cycle correction circuit included in the delay locked loop of FIG. 1.

Referring to FIG. 24, in certain embodiments, the second duty cycle correction circuit 30 may include an integrator 31, a comparator COMP 33, a counter 35 and a duty adjust circuit 37.

The integrator 31 may receive the output clock signal O_CLK through the feedback loop. The integrator 31 may generate a first voltage V1 by performing the integration operation on a high level period of the output clock signal O_CLK, and generate a second voltage V2 by performing the integration operation on a low level period of the output clock signal O_CLK. Therefore, a magnitude of the first voltage V1 may be proportional to a length of the high level period of the output clock signal O_CLK, and a magnitude of the second voltage V2 may be proportional to a length of the low level period of the output clock signal O_CLK. In some example embodiments, the integrator 31 may perform the integration operation using a charge pump.

The comparator 33 may compare the magnitude of the first voltage V1 and the magnitude of the second voltage V2 to generate an up-down signal UD. For example, the comparator 33 may generate the up-down signal UD having a first logic level when the magnitude of the first voltage V1 is greater than the magnitude of the second voltage V2, and generate the up-down signal UD having a second logic level when the magnitude of the second voltage V2 is greater than the magnitude of the first voltage V1.

The counter 35 may generate a duty control code DUTY_CC based on the up-down signal UD. For example, the counter 35 may perform an up-count operation on the duty control code DUTY_CC to increase the duty control code DUTY_CC when the counter 35 receives the up-down signal UD having the first logic level from the comparator 33, and perform a down-count operation on the duty control code DUTY_CC to decrease the duty control code DUTY_CC when the counter 35 receives the up-down signal UD having the second logic level from the comparator 33. The counter 35 may up-count and down-count the duty control code DUTY_CC by at least one count. The duty control code DUTY_CC may be, for example, an integer and include a sign to indicate whether it is a positive or negative number, e.g. for indicating a shift to the left or right (in time).

The duty adjust circuit 37 may generate the output clock signal O_CLK by adjusting a duty cycle of the delayed corrected clock signal DC_CLK based on the duty control code DUTY_CC. The output clock signal O_CLK may be referred to herein as separate instances (e.g., in time), such as a first output clock signal O_CLK that may occur at a first time, and a second output clock signal O_CLK that may occur at a later time and may be based on duty adjustments made by the duty adjust circuit 37 based on the first output clock signal O_CLK.

In some example embodiments, the duty adjust circuit 37 may generate the output clock signal O_CLK by changing a slew rate of the delayed corrected clock signal DC_CLK based on the duty control code DUTY_CC.

For example, the duty adjust circuit 37 may internally generate a temporary clock signal, which transitions with a slope based on the duty control code DUTY_CC, in a process of inverting the delayed corrected clock signal DC_CLK and generate the output clock signal O_CLK by inverting the temporary clock signal.

In some example embodiments, the duty adjust circuit 37 may include a first inverter and a second inverter. The first inverter may generate the temporary clock signal by inverting the delayed corrected clock signal DC_CLK. The first inverter may control a slew rate of a rising transition of the temporary clock signal and a slew rate of a falling transition of the temporary clock signal based on the duty control code DUTY_CC. The second inverter may generate the output clock signal O_CLK by inverting the temporary clock signal.

Therefore, the duty adjust circuit 37 may adjust a duty cycle of the delayed corrected clock signal DC_CLK by changing a slew rate of the temporary clock signal based on the duty control code DUTY_CC to generate the output clock signal O_CLK.

As illustrated in FIG. 24, the second duty cycle correction circuit 30 may repeatedly perform the operation described above with reference to FIG. 24 through the feedback loop. Therefore, the second duty cycle correction circuit 30 may correct the duty cycle error of the delayed corrected clock signal DC_CLK precisely at a relatively high resolution to generate the output clock signal O_CLK. Because aspects of the duty cycle correction performed by the second duty cycle correction circuit 30 are performed in an analog manner, the second duty cycle correction circuit 30 may be referred to as an analog duty cycle correction circuit, or may be referred to as configured to adjust or correct a duty cycle in an analog manner or using an analog operation.

Figure 25:
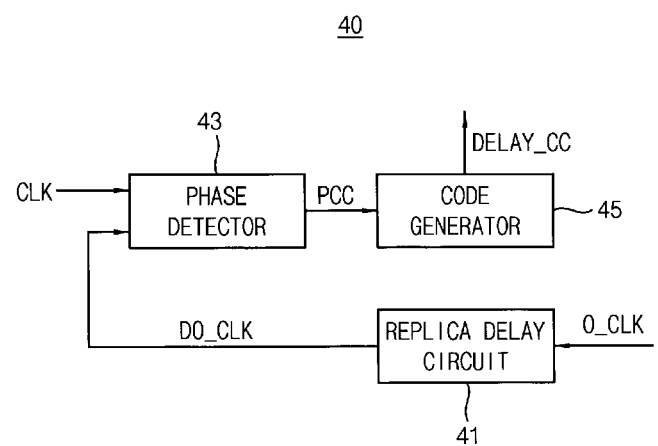
FIG. 25 is a block diagram illustrating an example of a delay control circuit included in the delay locked loop of FIG. 1.

FIG. 25 is a block diagram illustrating an example of a delay control circuit included in the delay locked loop of FIG. 1.

Referring to FIG. 25, delay control circuit 40 may include a replica delay circuit 41, a phase detector 43 and a code generator 45.

The replica delay circuit 41 may receive the output clock signal O_CLK from the second duty cycle correction circuit 30. The replica delay circuit 41 may generate a delayed output clock signal DO_CLK by delaying the output clock signal O_CLK.

In some example embodiments, the replica delay circuit 41 may be implemented by modeling a delay on a path from the delay locked loop 1000 to an external electronic device, which operates using the output clock signal O_CLK generated by the delay locked loop 1000. The replica delay circuit 41 may, e.g., function to match delays on the output clock due to its use by a memory device external to the delay locked loop 1000.

The phase detector 43 may compare a phase of the clock signal CLK and a phase of the delayed output clock signal DO_CLK to generate a phase control signal PCC. For example, the phase detector 43 may generate the phase control signal PCC having a first logic level when the clock signal CLK leads the delayed output clock signal DO_CLK, and generate the phase control signal PCC having a second logic level when the clock signal CLK lags the delayed output clock signal DO_CLK.

The code generator 45 may generate the delay control code DELAY_CC based on the phase control signal PCC. For example, the code generator 45 may perform an up-count operation on the delay control code DELAY_CC to increase the delay control code DELAY_CC when the code generator 45 receives the phase control signal PCC having the first logic level from the phase detector 43, and perform a down-count operation on the delay control code DELAY_CC to decrease the delay control code DELAY_CC when the code generator 45 receives the phase control signal PCC having the second logic level from the phase detector 43.

The code generator 45 may provide the delay control code DELAY_CC to the delay line 20 as depicted in FIG. 1.

The delay line 20 may generate the delayed corrected clock signal DC_CLK by delaying the corrected clock signal C_CLK for a time corresponding to the delay control code DELAY_CC received from the delay control circuit 40. The delay line 20 may delay the corrected clock signal C_CLK via a plurality of inverters (e.g. similar to the structure of the clock delay circuit 230 of FIG. 16) or by any structure that is able to delay the corrected clock signal C_CLK by an amount of time corresponding to the delay control code DELAY_CC.

As described above with reference to FIGS. 1 to 25, the first duty cycle correction circuit 10 may generate the corrected clock signal C_CLK by correcting the duty cycle error of the clock signal CLK in the digital manner based on the time-to-digital conversion without using a feedback loop. Therefore, the first duty cycle correction circuit 10 may correct the duty cycle error of the clock signal CLK at a relatively high speed to generate the corrected clock signal C_CLK.

In addition, the second duty cycle correction circuit 30 may receive the output clock signal O_CLK through the feedback loop, and generate the output clock signal O_CLK (e.g., a second output clock signal) by correcting the duty cycle error of the delayed corrected clock signal DC_CLK in the analog manner based on the integration operation performed on the output clock signal O_CLK (e.g., a first output clock signal). Therefore, the second duty cycle correction circuit 30 may correct the duty cycle error of the delayed corrected clock signal DC_CLK precisely at a relatively high resolution to generate the output clock signal O_CLK.

Therefore, in the delay locked loop 1000 according to example embodiments, the first duty cycle correction circuit 10 may correct the duty cycle error of the clock signal CLK at a relatively high speed to generate the corrected clock signal C_CLK in a first stage, the delay line 20 may delay the corrected clock signal C_CLK based on the delay control code DELAY_CC to generate the delayed corrected clock signal DC_CLK in a second stage, and the second duty cycle correction circuit 30 may correct the duty cycle error of the delayed corrected clock signal DC_CLK precisely at a relatively high resolution using a feedback loop to generate the output clock signal O_CLK in a third stage. As such, the delay locked loop 1000 may operate at a high speed while having a high resolution.

Thus, according to various of the above embodiments, a delay locked loop, which may be generally described as an electronic device, as explained further below, may include a first duty cycle correction circuit configured to receive a clock signal, detect a first duty cycle error of the clock signal without using a feedback loop, and generate a corrected clock signal by adjusting a duty cycle of the clock signal by an amount depending on the first duty cycle error of the clock signal; a delay circuit configured to receive a duty cycle adjusted clock signal from the first duty cycle correction circuit and output a delayed clock signal; and a second duty cycle correction circuit configured to receive the delayed clock signal, to receive a first output clock signal through a feedback loop of the second duty cycle correction circuit, to detect a second duty cycle error of the first output clock signal by performing an integration operation on the first output clock signal, and to generate a second output clock signal by performing duty cycle correction on the first output clock signal based on the detected second duty cycle error.

The first duty cycle correction circuit may be a digital circuit, and the second duty cycle correction circuit may be an analog circuit. For example, the second duty cycle correction circuit may be configured to adjust a slew rate of the delayed corrected clock signal by an amount depending on the second duty cycle error of the output clock signal.

The electronic device may additionally include a delay control circuit configured to generate a delay control code based on the clock signal and the first output clock signal, wherein a delay amount of the delay circuit is controlled based on an output from the delay control circuit.

In some embodiments, the first duty cycle correction circuit includes a time-to-digital converter; and the second duty cycle correction circuit includes an analog duty cycle correction circuit.

According to various of the above embodiments, stated in a different way, an electronic device includes a first duty cycle correction circuit configured to detect a duty cycle error of a clock signal by performing a digital operation on the clock signal, and to generate a corrected clock signal by adjusting a duty cycle of the clock signal based on the detected duty cycle error of the clock signal; a delay line configured to generate a delayed corrected clock signal by delaying the corrected clock signal based on a delay control code; a second duty cycle correction circuit configured to receive the delayed corrected clock signal and to receive an output clock signal of the second duty cycle correction circuit through a feedback loop, to detect a duty cycle error of the output clock signal by performing an analog operation on the output clock signal, and to generate a next iteration of the output clock signal by adjusting a duty cycle of the delayed corrected clock signal based on the detected duty cycle error of the output clock signal; and a delay control circuit configured to generate the delay control code based on the clock signal and the output clock signal.

The first duty cycle correction circuit may perform duty cycle correction using a digital operation without using a feedback loop; and the second duty cycle correction circuit may be configured to perform an integration operation on the output clock signal, and to generate the next iteration of the output clock signal by performing duty cycle correction on the output clock signal based on the detected duty cycle error of the output clock signal.

The first duty cycle correction circuit may include a time-to-digital converter. The second duty cycle correction circuit may be configured to adjust a slew rate of the delayed corrected clock signal by an amount depending on the second duty cycle error of the output clock signal.

Figure 26:
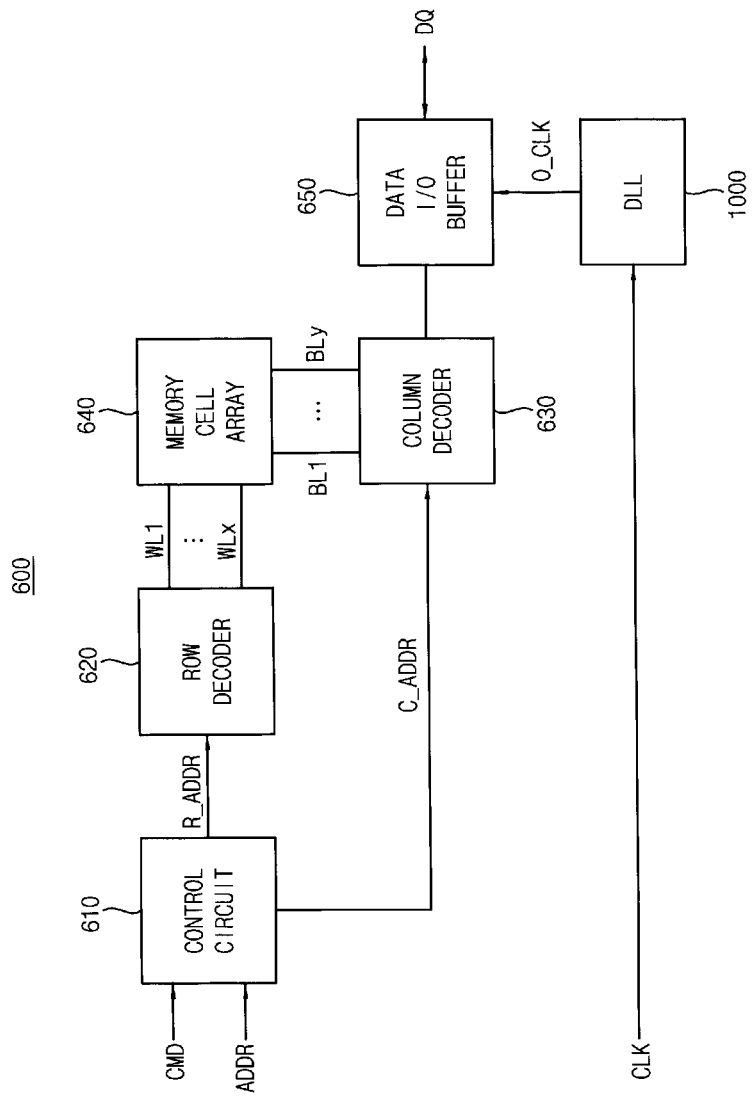
FIG. 26 is a block diagram illustrating a memory device according to example embodiments.

FIG. 26 is a block diagram illustrating a memory device according to example embodiments.

Referring to FIG. 26, the memory device 600 includes a control circuit 610, a row decoder 620, a column decoder 630, a memory cell array 640, a data input/output buffer 650 and a delay locked loop 1000.

The memory cell array 640 may include a plurality of memory cells arranged in rows and columns.

The row decoder 620 may be coupled to the plurality of memory cells included in the memory cell array 640 through a plurality of word lines WL1~WLx. For example, a first word line WL1 may be coupled to memory cells arranged in a first row, and an x-th word line WLx may be coupled to memory cells arranged in an x-th row.

The column decoder 630 may be coupled to the plurality of memory cells included in the memory cell array 640 through a plurality of bit lines BL1~BLy. For example, a first bit line BL1 may be coupled to memory cells arranged in a first column, and a y-th word line BLy may be coupled to memory cells arranged in a y-th column.

The delay locked loop 1000 may receive a clock signal CLK. The delay locked loop 1000 may generate an output clock signal O_CLK, which is synchronized with the clock signal CLK, by correcting a duty cycle error of the clock signal CLK.

The delay locked loop 1000 included in the memory device 600 may be implemented with the delay locked loop 1000 of FIG. 1. Exemplary structures and operations of the delay locked loop 1000 of FIG. 1 are described above with reference to FIGS. 1 to 25. Therefore, duplicated description may be omitted.

The control circuit 610 may control overall operations of the memory device 600. For example, the control circuit 610 may generate control signals by decoding a command signal CMD, which is provided by an external source (e.g. a host device or a memory controller), to control the memory device 600 to perform an operation (e.g. a write operation or a read operation). In addition, the control circuit 610 may generate a row address R_ADDR and a column address C_ADDR by decoding an address signal ADDR, which is provided by the external source. The control circuit 610 may provide the row address R_ADDR to the row decoder 620 and provide the column address C_ADDR to the column decoder 630.

The row decoder 620 may activate one of the plurality of word lines WL1~WLx corresponding to the row address R_ADDR.

In a write mode, the data input/output buffer 650 may store data DQ, which is provided by the external source, and provide the data DQ to the column decoder 630. The column decoder 630 may write the data DQ received from the data input/output buffer 650 in a memory cell, which is coupled to a bit line corresponding to the column address C_ADDR.

In a read mode, the column decoder 630 may receive data DQ from the memory cell array 640 through a bit line corresponding to the column address C_ADDR, and provide the data DQ to the data input/output buffer 650. The data input/output buffer 650 may store the data DQ received from the column decoder 630, and output the data DQ to the external source in synchronization with the output clock signal O_CLK provided by the delay locked loop 1000.

As described above, since the memory device 600 includes the delay locked loop 1000 of FIG. 1, the memory device 600 may output the data DQ in synchronization with the clock signal CLK in the read mode even if a frequency of the clock signal CLK is relatively high. The term "electronic device" as used herein, may refer to a memory device, such as memory device 600, or may refer to a delay locked loop, such as delay locked loop 1000, which may be included in a memory device. An electronic device may also refer to a device such as a memory card, memory module, cellular phone, laptop computer, tablet, or other personal electronics device or component thereof. An external source may refer to a memory controller in relation to a memory device such as a semiconductor memory chip having a memory array, the DLL 1000, and peripheral circuitry as described in connection with FIG. 26. Or, if a memory controller and memory device are part of the same system, an external source may be an additional external controller, or a host.

Figure 27:
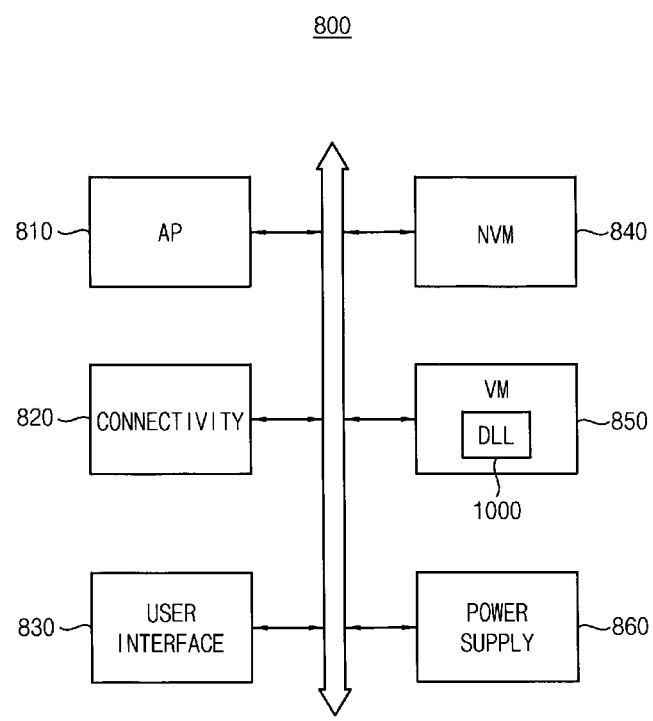
FIG. 27 is a block diagram illustrating an electronic device according to example embodiments.

FIG. 27 is a block diagram illustrating an electronic device according to example embodiments.

Referring to FIG. 27, an electronic device 800 includes an application processor 810, a connectivity circuit 820, a user interface 830, a nonvolatile memory device NVM 840, a volatile memory device VM 850 and a power supply 860. In some embodiments, the electronic device 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity circuit 820 may perform wired or wireless communication with an external device. For example, the connectivity circuit 820 may perform Ethernet communication, near field communication (NFC), radio frequency identification (RFID) communication, mobile telecommunication, memory card communication, universal serial bus (USB) communication, etc. In some embodiments, the connectivity circuit 820 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 850 may store data processed by the application processor 810, or may operate as a working memory. The volatile memory device 850 may include the delay locked loop DLL 1000 of FIG. 1. For example, the volatile memory device 850 may be implemented by the memory device 600 of FIG. 26. A structure and an operation of the memory device 600 of FIG. 26 are described above with reference to FIGS. 1 to 26. Therefore, duplicated description about the volatile memory device 850 will be omitted.

The nonvolatile memory device 840 may store a boot image for booting the electronic device 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the electronic device 800.

In some embodiments, the electronic device 800 may further include an image processor, and/or a storage device, such as a memory card, a solid state drive (SSD), a hard disk drive (HDD), a CD-ROM, etc.

In some embodiments, the electronic device 800 and/or components of the electronic device 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 28:
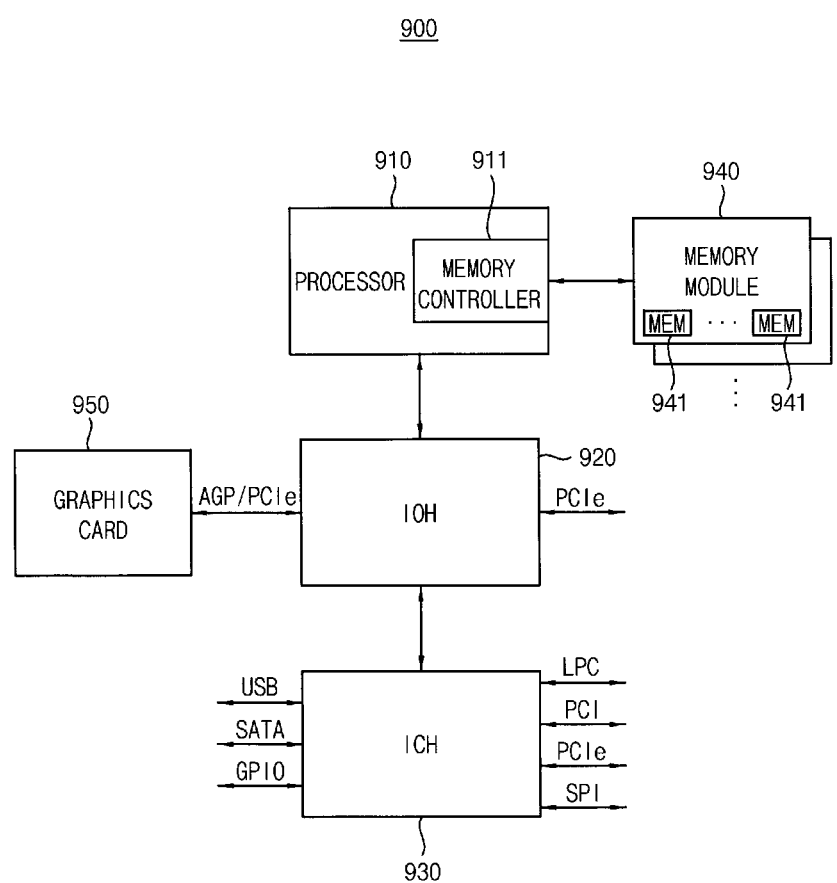
FIG. 28 is a block diagram illustrating a computing system according to example embodiments.

FIG. 28 is a block diagram illustrating a computing system according to example embodiments.

Referring to FIG. 28, a computing system 900 includes a processor 910, an input/output hub (IOH) 920, an input/output controller hub (ICH) 930, at least one memory module 940 and a graphics card 950. In some embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. Although FIG. 28 illustrates the computing system 900 including one processor 910, in some embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920. The input/output hub 920 including the memory controller 911 may be referred to as memory controller hub (MCH).

The memory module 940 may include a plurality of memory devices MEM 941 that store data provided from the memory controller 911. The memory device 941 may include the delay locked loop DLL 1000 of FIG. 1. For example, the memory device 941 may be implemented with the memory device 600 of FIG. 26. A structure and an operation of the memory device 600 of FIG. 26 are described above with reference to FIGS. 1 to 26. Therefore, duplicated description about the memory device 941 will be omitted.

The input/output hub 920 or the memory controller hub may manage data transfer between the processor 910 and the devices, such as the graphics card 950. The input/output hub 920 or the memory controller hub may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 28 illustrates the computing system 900 including one input/output hub 920, in some embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as an integrated graphics device. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920, the input/output controller hub 930, and the memory module 940 may be implemented as a single chipset.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An electronic device, comprising:
a first duty cycle correction circuit configured to receive a clock signal and detect a duty cycle error of the clock signal by performing a time-to-digital conversion on the clock signal, and to generate a corrected clock signal by adjusting a duty cycle of the clock signal based on the detected duty cycle error of the clock signal;
a delay line configured to generate a delayed corrected clock signal by delaying the corrected clock signal based on a delay control code;
a second duty cycle correction circuit configured to receive a first output clock signal through a feedback loop, to detect a duty cycle error of the first output clock signal by performing an integration operation on the first output clock signal, and to generate a second output clock signal by adjusting a duty cycle of the delayed corrected clock signal based on the detected duty cycle error of the first output clock signal; and
a delay control circuit configured to receive the clock signal and to generate the delay control code based on the clock signal and the first output clock signal.

2. An electronic device comprising:
a first duty cycle correction circuit configured to detect a duty cycle error of a clock signal by performing a time-to-digital conversion on the clock signal, and to generate a corrected clock signal by adjusting a duty cycle of the clock signal based on the detected duty cycle error of the clock signal;
a delay line configured to generate a delayed corrected clock signal by delaying the corrected clock signal based on a delay control code;
a second duty cycle correction circuit configured to receive a first output clock signal through a feedback loop, to detect a duty cycle error of the first output clock signal by performing an integration operation on the first output clock signal, and to generate a second output clock signal by adjusting a duty cycle of the delayed corrected clock signal based on the detected duty cycle error of the first output clock signal; and
a delay control circuit configured to generate the delay control code based on the clock signal and the first output clock signal,
wherein the first duty cycle correction circuit includes:
a duty cycle error detection circuit configured to generate a sign signal, which indicates a longer period between a high level period of the clock signal and a low level period of the clock signal, and a duty error digital code, which corresponds to a difference between a length of the high level period of the clock signal and a length of the low level period of the clock signal;

a phase align circuit configured to output one of the clock signal and an inverted clock signal, which corresponds to an inverted version of the clock signal, as a first internal clock signal, based on a logic level of the sign signal, and to generate a second internal clock signal by delaying the other one of the clock signal and the inverted clock signal by an amount of time corresponding to half of the duty error digital code; and a clock synthesis circuit configured to generate the corrected clock signal, which toggles at each rising edge of the first internal clock signal and each rising edge of the second internal clock signal.

3. The electronic device of claim 2, wherein the duty cycle error detection circuit includes:

a first digital code generator configured to generate a high digital code and a low digital code, which correspond to the length of the high level period of the clock signal and the length of the low level period of the clock signal, respectively, to determine a longer period and a shorter period between the high level period of the clock signal and the low level period of the clock signal based on the high digital code and the low digital code, to generate the sign signal indicating the longer period of the clock signal, and to output one of the high digital code and the low digital code, which corresponds to the shorter period of the clock signal, as a first digital code;

a clock delay circuit configured to generate a delayed clock signal by delaying the clock signal by an amount of time corresponding to the first digital code; and a second digital code generator configured to generate the duty error digital code, which corresponds to a length from a start of the longer period of the delayed clock signal to an end of the longer period of the clock signal, based on the logic level of the sign signal, wherein the longer period of the delayed clock signal is the longer of a high level period of the delayed clock signal and a low level period of the delayed clock signal, and wherein the longer period of the clock signal is the longer of the high level period of the clock signal and the low level period of the clock signal.

4. The electronic device of claim 3, wherein the first digital code generator generates the high digital code and the low digital code by performing the time-to-digital conversion on the length of the high level period of the clock signal and the length of the low level period of the clock signal, respectively, based on a first unit delay, and wherein the second digital code generator generates the duty error digital code by performing the time-to-digital conversion on the length from the start of the longer period of the delayed clock signal to the end of the longer period of the clock signal, based on a second unit delay smaller than the first unit delay.

5. The electronic device of claim 3, wherein the first duty cycle correction circuit further includes:

a multiplexer configured to output one of the clock signal and the corrected clock signal in response to a bypass signal, wherein the first digital code generator activates the bypass signal when the high digital code is identical to the low digital code.

6. The electronic device of claim 3, wherein the first duty cycle correction circuit further includes:

an OR gate configured to perform an OR operation on a first control signal and a second control signal to generate a bypass signal; and a multiplexer configured to output one of the clock signal and the corrected clock signal in response to the bypass signal, wherein the first digital code generator activates the first control signal when the high digital code is identical to the low digital code, and the second digital code generator activates the second control signal when the duty error digital code is smaller than a threshold code.

7. The electronic device of claim 2, wherein the phase align circuit includes:

a phase splitter configured to receive the clock signal, and to output the clock signal and the inverted clock signal in synchronization with each other;

a first path selector configured, based on the logic level of the sign signal, to output one of the clock signal and the inverted clock signal as the first internal clock signal and to output the other one of the clock signal and the inverted clock signal as a third internal clock signal;

a clock delay circuit configured to generate the second internal clock signal by delaying the third internal clock signal for a time corresponding to half of the duty error digital code; and a second path selector configured, based on the logic level of the sign signal, to output one of the first internal clock signal and the second internal clock signal through a first output electrode and to output the other one of the first internal clock signal and the second internal clock signal through a second output electrode.

8. The electronic device of claim 7, wherein the first path selector:

outputs the inverted clock signal as the first internal clock signal and the clock signal as the third internal clock signal when the sign signal represents that the high level period of the clock signal is longer than the low level period of the clock signal; and outputs the clock signal as the first internal clock signal and the inverted clock signal as the third internal clock signal when the sign signal represents that the low level period of the clock signal is longer than the high level period of the clock signal.

9. The electronic device of claim 1, wherein the second duty cycle correction circuit includes:

an integrator configured to generate a first voltage and a second voltage by performing the integration operation on a high level period of the first output clock signal and a low level period of the first output clock signal, respectively;

a comparator configured to compare a magnitude of the first voltage with a magnitude of the second voltage to generate an up-down signal;

a counter configured to generate a duty control code based on the up-down signal; and a duty adjust circuit configured to generate a temporary clock signal, which transitions with a slope based on the duty control code, in a process of inverting the delayed corrected clock signal, and to generate the second output clock signal by inverting the temporary clock signal.

10. The electronic device of claim 1, wherein the delay control circuit includes:

a replica delay circuit configured to generate a delayed output clock signal by delaying the first output clock signal;

a phase detector configured to compare a phase of the clock signal and a phase of the delayed output clock signal to generate a phase control signal; and a code generator configured to generate the delay control code based on the phase control signal.

11. An electronic device comprising:
a first duty cycle correction circuit configured to detect a duty cycle error of a clock signal by performing a time-to-digital conversion on the clock signal, and to generate a corrected clock signal by adjusting a duty cycle of the clock signal based on the detected duty cycle error of the clock signal;
a delay line configured to generate a delayed corrected clock signal by delaying the corrected clock signal based on a delay control code;
a second duty cycle correction circuit configured to receive a first output clock signal through a feedback loop, to detect a duty cycle error of the first output clock signal by performing an integration operation on the first output clock signal, and to generate a second output clock signal by adjusting a duty cycle of the delayed corrected clock signal based on the detected duty cycle error of the first output clock signal; and
a delay control circuit configured to generate the delay control code based on the clock signal and the first output clock signal,
wherein the second output clock signal is synchronized with the clock signal, and does not include a duty cycle error of the clock signal, and further comprising:
a memory cell array including a plurality of memory cells; and
a data input/output buffer configured to store data read from the plurality of memory cells, and to output the data in synchronization with the second output clock signal.

12. An electronic device, comprising:
a first duty cycle correction circuit configured to receive a clock signal, detect a first duty cycle error of the clock signal without using a feedback loop, and generate a corrected clock signal by adjusting a duty cycle of the clock signal by an amount depending on the first duty cycle error of the clock signal;
a delay circuit configured to receive a duty cycle adjusted clock signal from the first duty cycle correction circuit and output a delayed clock signal;
a second duty cycle correction circuit configured to receive the delayed clock signal, to receive a first output clock signal through a feedback loop of the second duty cycle correction circuit, to detect a second duty cycle error of the first output clock signal by performing an integration operation on the first output clock signal, and to generate a second output clock signal by performing duty cycle correction on the first output clock signal based on the detected second duty cycle error, and
a delay control circuit configured to generate a delay control code based on the clock signal and the first output clock signal,
wherein a delay amount of the delay circuit is controlled based on an output from the delay control circuit.

13. The electronic device of claim 12, wherein the first duty cycle correction circuit is a digital circuit, and the second duty cycle correction circuit is an analog circuit.

14. The electronic device of claim 12, wherein the second duty cycle correction circuit is configured to adjust a slew rate of the delayed corrected clock signal by an amount depending on the second duty cycle error of the output clock signal.

15. The electronic device of claim 12, wherein:
the first duty cycle correction circuit includes a time-to-digital converter; and
the second duty cycle correction circuit includes an analog duty cycle correction circuit.

16. An electronic device, comprising:
a first duty cycle correction circuit configured to detect a duty cycle error of a clock signal by performing a digital operation on the clock signal, and to generate a corrected clock signal by adjusting a duty cycle of the clock signal based on the detected duty cycle error of the clock signal;
a delay line configured to generate a delayed corrected clock signal by delaying the corrected clock signal based on a delay control code;
a second duty cycle correction circuit configured to receive the delayed corrected clock signal and to receive an output clock signal of the second duty cycle correction circuit through a feedback loop, to detect a duty cycle error of the output clock signal by performing an analog operation on the output clock signal, and to generate a next iteration of the output clock signal by adjusting a duty cycle of the delayed corrected clock signal based on the detected duty cycle error of the output clock signal; and
a delay control circuit configured to generate the delay control code based on the clock signal and the output clock signal,
wherein the first duty cycle correction circuit includes a time-to-digital converter.

17. The electronic device of claim 16, wherein:
the first duty cycle correction circuit is configured to perform duty cycle correction using a digital operation without using a feedback loop; and
the second duty cycle correction circuit is configured to perform an integration operation on the output clock signal, and to generate the next iteration of the output clock signal by performing duty cycle correction on the output clock signal based on the detected duty cycle error of the output clock signal.

18. The electronic device of claim 16, wherein the second duty cycle correction circuit is configured to adjust a slew rate of the delayed corrected clock signal by an amount depending on the second duty cycle error of the output clock signal.

* * * * *